(12) United States Patent
Gopinath et al.

(10) Patent No.: US 12,517,172 B2
(45) Date of Patent: Jan. 6, 2026

(54) METHODS AND APPARATUS TO ESTIMATE ANALOG TO DIGITAL CONVERTER (ADC) ERROR

(71) Applicant: Texas Instruments Incorporated, Dallas, TX (US)

(72) Inventors: Nithin Gopinath, Bangalore (IN); Sai Aditya Nurani, Bengalaru (IN); Viswanathan Nagarajan, Bangalore (IN); Himanshu Varshney, Bangalore (IN); Mishab I, Manjeri (IN); Mujammil Patel, Mumbai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 203 days.

(21) Appl. No.: 18/217,292

(22) Filed: Jun. 30, 2023

(65) Prior Publication Data

US 2025/0004049 A1 Jan. 2, 2025

(51) Int. Cl.
*G01R 31/317* (2006.01)
(52) U.S. Cl.
CPC .............................. *G01R 31/31703* (2013.01)
(58) Field of Classification Search
None
See application file for complete search history.

(56) References Cited

U.S. PATENT DOCUMENTS

| 9,525,428 | B2 * | 12/2016 | Devarajan | ............. | H03M 1/128 |
| 11,955,984 | B2 * | 4/2024 | Nagarajan | ............ | H03M 1/0641 |
| 2008/0106452 | A1 * | 5/2008 | Kao | ................. | H03K 19/17732 |
| | | | | | 326/39 |
| 2016/0329905 | A1 | 11/2016 | Ozeki et al. | | |
| 2023/0082872 | A1 * | 3/2023 | Viswanathan | ...... | H03M 1/1009 |
| | | | | | 341/120 |
| 2024/0259029 | A1 * | 8/2024 | Nagarajan | ........... | H03M 1/1014 |

FOREIGN PATENT DOCUMENTS

EP 4149004 A1 3/2023

OTHER PUBLICATIONS

United States Patent and Trademark Office, "Analog-To-Digital Converter (ADC) Having Selective Comparator Offset Error Tracking and Related Corrections" filed in connection with U.S. Appl. No. 17/828,967, 65 Pages.
International Search Report for PCT/US2024/035955, dated Nov. 8, 2024.

* cited by examiner

*Primary Examiner* — Jermele M Hollington
(74) *Attorney, Agent, or Firm* — Mandy Barsilai Fernandez; Frank D. Cimino

(57) ABSTRACT

An example apparatus includes programmable circuitry configured to: determine a first output voltage from a first analog to digital converter (ADC) responsive to the first ADC and a second ADC both receiving a first input voltage; determine a first output voltage from a second ADC responsive to the first ADC and a second ADC both receiving the first input voltage; determine a second output voltage from the first ADC responsive to the first ADC receiving a second input voltage and the second ADC receiving the first input voltage; and determine an error value for the first ADC based on: (a) a difference between the first output voltage from the first ADC and the first output voltage from the second ADC, and (b) a difference between the first output voltage from the first ADC and the second output voltage from the first ADC.

20 Claims, 13 Drawing Sheets

600

214A  214B

| STATE | DITHER | DITHER | DIFFERENCE |
|---|---|---|---|
| 0000 | -7*SL/8 | -7*SL/8 | 0 |
| 0010 | -3*SL/8 | -3*SL/8 | 0 |
| 0100 | -SL/8 | -SL/8 | 0 |
| 0110 | +5*SL/8 | +5*SL/8 | 0 |
| 1000 | -7*SL/8 | -3*SL/8 | +SL//2 |
| 1010 | -3*SL/8 | -7*SL/8 | -SL/2 |
| 1100 | +SL/8 | +5*SL/8 | +SL//2 |
| 1110 | +5*SL/8 | +SL/8 | -SL/2 |
| 0001 | -5*SL/8 | -5*SL/8 | 0 |
| 0011 | -SL/8 | -SL/8 | 0 |
| 0101 | +3*SL/8 | +3*SL/8 | 0 |
| 0111 | +7*SL/8 | +7*SL/8 | 0 |
| 1001 | -5*SL/8 | -3*SL/8 | +SL/4 |
| 1011 | -SL/8 | -3*SL/8 | -SL/4 |
| 1101 | +3*SL/8 | +5*SL/8 | +SL/4 |
| 1111 | +7*SL/8 | +5*SL/8 | -SL/4 |

FIG. 6

METHODS AND APPARATUS TO ESTIMATE ANALOG TO DIGITAL CONVERTER (ADC) ERROR

TECHNICAL FIELD

This description relates generally to analog to digital converters and, more particularly, to methods and apparatus to estimate ADC error.

BACKGROUND

Information may be represented in electronic devices as either a digital or analog signal. In many applications, information requires conversion from an analog signal to a digital signal. For example, an analog voltage may be received over a transmission medium. The analog voltage may be transformed into a digital value. The digital voltage may be stored in a memory circuit, interpreted by processor circuitry, etc.

ADC circuits perform the conversion of analog values to digital voltages and are used in a variety of computing devices. In some examples, the analog to digital conversion can degrade the quality of the signal, causing information to be lost or distorted. Therefore, signal integrity may be used as a performance metric of an ADC circuit.

SUMMARY

For methods and apparatus to correct for ADC error, an example apparatus includes programmable circuitry configured to: determine a first output voltage from a first analog to digital converter (ADC) responsive to the first ADC and a second ADC both receiving a first input voltage; determine a first output voltage from a second ADC responsive to the first ADC and a second ADC both receiving the first input voltage; determine a second output voltage from the first ADC responsive to the first ADC receiving a second input voltage and the second ADC receiving the first input voltage; and determine an error value for the first ADC based on: (a) a difference between the first output voltage from the first ADC and the first output voltage from the second ADC, and (b) a difference between the first output voltage from the first ADC and the second output voltage from the first ADC.

BRIEF DESCRIPTION OF THE DRAWINGS

FIG. 6 is a table describing an example implementation of dither signals provided to the internal ADC circuits of FIG. 2.

The same reference numbers or other reference designators are used in the drawings to designate the same or similar (functionally and/or structurally) features.

DETAILED DESCRIPTION

Figure 1:
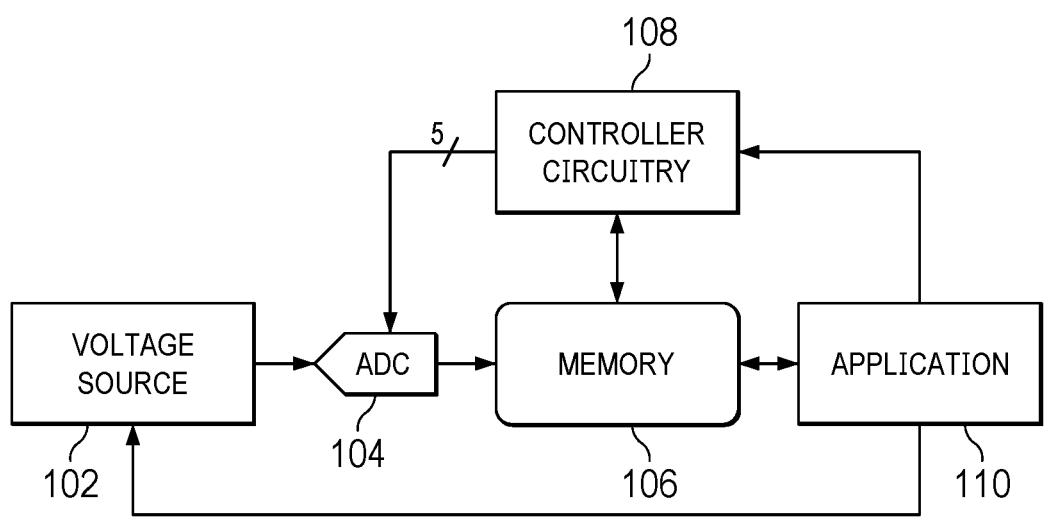
FIG. 1 is a block diagram of an example implementation of a compute environment.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

A wide variety of architectures are used throughout industry to implement ADC circuits. Designers or manufacturers of an electronic device may choose an ADC based on factors that include but are not limited to cost of implementation, the size, speed, precision, and/or accuracy of the ADC circuit, system-level requirements of the electronic device, etc. One category of ADC architectures are parallel ADCs. As used herein, a parallel ADC architecture refers to any system with two or more ADCs connected to a shared input.

In general, techniques used by parallel ADC architectures to convert an input analog signal to a digital output signal can be characterized as non-linear transfer functions. A technique may be characterized as non-linear if there exists a linear change in the input signal that does not produce an equally linear change in the output signal. Outputs produced by non-linear transfer functions can require corrections so that the accuracy of information within the output signal can be maintained.

A non-linear transfer function may change over time due to variations in temperature, noise, etc. For example, the relationship between an ADC input and corresponding output at a first time may be a characterized by a different transfer function than the relationship between the input and output of the same ADC at a second time. Accordingly, a controller may repeatedly measure an ADC to obtain a non-linear transfer function at different times and correct digital signals produced within a threshold amount of time from the measurement. In some examples, the measurement of a non-linear transfer function is referred to as calibration.

Accurate and precise calibration requires the measurement of the non-linear transfer function to occur when the ADC is receiving a known signal at the input, which is referred to as a calibration mode. During calibration mode, the ADC may receive input from a controller providing the known signal rather than the voltage source (which provides an unknown analog signal). While such a calibration ensures subsequent corrections to digital outputs are precise and accurate, the calibration can also cause delay because during calibration mode a period is introduced in which the ADC is not converting the analog signal from the voltage source. As used herein, the period in which an ADC receives an analog signal from a voltage source separate from the controller may be referred to as mission mode.

Some parallel ADC architectures mitigate calibration delays by only calibrating a subset of the parallel ADCs simultaneously. For example, consider a two-ADC parallel architecture in which each parallel ADC requires calibration every ten milliseconds (ms). A controller may stagger the operation of the parallel ADCs such that: a first ADC is in calibration mode and a second ADC is in mission mode at t=0 ms, the first ADC is in mission mode and a second ADC is in calibration mode at t=5 ms, the first ADC is in calibration mode and the second ADC is in mission mode at t=10 ms, etc.

Some sources of error remain undetected by the foregoing techniques. For example, the asynchronous usage of parallel ADCs may result in some algorithms relying on the output of a first ADC in mission mode to calibrate a second ADC in calibration mode. However, the input during mission mode (e.g., an external voltage source) provides an unknown amount of error that the calibration algorithm then needs to correct for through estimation. The dynamic nature of an unknown signal may cause the estimation technique to be inaccurate, thereby leading to inaccurate calibrations.

As an additional example, a device implementing the two-ADC parallel architecture with the calibration timing described above would not operate quickly enough to detect flicker noise above 100 Hertz (Hz). As used herein, flicker noise refers to noise in which the power of the noise is inverse to the frequency of the signal. In some examples, flicker noise causes offset error in a comparator that distorts the digital output signal. As used herein, offset error refers to the difference between the center of the least significant code and the center of the same code on an ideal ADC with the same number of bits.

The use of a known signal for an input during calibration relies on the premise that the transfer function of the ADC remains the same whether the ADC is in calibration mode (in which a controller measures the ADC transfer function with the known signal) or in mission mode (in which the controller uses the transfer function to correct the conversion of an unknown analog signal into a digital output). However, any difference that occurs between the two modes (e.g., a difference in the internal impedance of the comparators) can cause both offset errors and gain errors in the comparators, thereby producing additional error and distortion in the digital output signal. As used herein, gain error refers to the difference between the center of the most significant code after offset error correction and the center of the same code on an ideal ADC with the same number of bits. While some techniques may be used to track flicker noise offset error (e.g., chopper comparators), existing solutions fail to measure both flicker noise offset error and gain error.

Example methods, apparatus, and systems described herein describe a parallel ADC architecture that tracks both offset errors and static gain errors. An example ADC includes two parallel ADCs connected to a shared input. An example controller puts both ADCs in mission mode and tracks the error of an ADC by adding dither signals to the inputs of the ADCs. The example controller varies the difference between dither signals to provide different ADC inputs and obtain different ADC outputs. Each pair of inputs and outputs can be described by an equation. Accordingly, the example controller constructs a system of equations using various dither signal values and solves the system of equations to determine both offset and gain errors. Furthermore, any error introduced by the unknown signal generated by the voltage source ca cancels out in the system of equations because both parallel ADCs receive the unknown signal at the time the outputs are measured (e.g., during mission mode). The example controller solves the system of equations quickly enough to enable the tracking of high frequency flicker noise.

FIG. 1 is a block diagram of an example implementation of a compute environment. The compute environment 100 of FIG. 1 may be instantiated (e.g., creating an instance of, bring into being for any length of time, materialize, implement, etc.) by programmable circuitry such as a Central Processor Unit (CPU) executing first instructions. Additionally or alternatively, the compute environment 100 of FIG. 1 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 1 may, thus, be instantiated at the same or different times. Some or all of the circuitry of FIG. 1 may be instantiated, for example, in one or more threads executing concurrently on hardware and/or in series on hardware. Moreover, in some examples, some or all of the circuitry of FIG. 1 may be implemented by microprocessor circuitry executing instructions and/or FPGA circuitry performing operations to implement one or more virtual machines and/or containers. The example compute environment 100 includes an example voltage source 102, example input example ADC circuitry 104, example memory 106, example controller circuitry 108, and an example application 110.

The example voltage source 102 generates a voltage that changes over time. The voltage source 102 provides the voltage to the ADC circuitry 104 as an analog input signal. The voltage source 102 may be implemented as any type of device and may generate the voltage for any purpose. For example, the voltage source 102 may be sensor circuitry that generates the voltage to perform a measurement. In another example, the voltage source 102 is transceiver circuitry that generates the voltage in response to receiving data over a transmission medium (e.g., a cell network, a cable, etc.). In some examples, the voltage provided by the voltage source 102 is static and does not change. The voltage source 102 may be referred to as an alternate voltage source because it generates voltages unrelated to the controller circuitry 108.

The ADC circuitry 104 converts the analog input signa into digital output values (i.e., '0' and '1' bits) representative of the information in the analog voltages. In particular, the output of the ADC circuitry 104 is a digital signal which includes a high supply voltage for a logical '1' bit and a low supply voltage for a logical '0' bit. The example ADC circuitry 104 is described further in connection with FIG. 2.

The memory 106 stores the digital bits produced by the ADC circuitry 104. The memory 106 may be implemented as any type of memory. For example, the example memory 106 may be a volatile memory or a non-volatile memory. The volatile memory may be implemented by Synchronous Dynamic Random Access Memory (SDRAM), Dynamic Random Access Memory (DRAM), and/or any other type of RAM device. The non-volatile memory may be implemented by flash memory and/or any other desired type of memory device.

The controller circuitry 108 provides control signals to the ADC circuitry 104. The control signals are used to switch the ADC circuitry 104 between mission mode and calibration mode as described above. The controller circuitry 108 also determines the error of the ADC circuitry 104 and corrects the values of digital bits in the memory 106 based on the error. The error corrected by the controller circuitry 108 includes but is not limited to harmonic distortion caused by both flicker noise and gain error within the ADC circuitry 104. In some examples, the controller circuitry 108 is instantiated by programmable circuitry executing controller instructions and/or configured to perform operations such as those represented by the flowchart(s) of FIGS. 7-10.

The controller circuitry 108 may be implemented by any type of processor device. Examples of processor devices include but are not limited to programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs). The hardware of the controller circuitry 108 is described further in connection with FIG. 13.

The example application 110 obtains the digital bits from the ADC circuitry 104 and may perform operations based on the digital bits. For example, the digital bits may represent sensor readings, and the application 110 may perform operations by presenting the readings to a user on a display. In some examples, the operations cause the application 110 to provide instructions to the voltage source 102 and/or the controller circuitry 108. The example application 110 may be implemented by any type of software, hardware, and/or firmware. The hardware of the controller circuitry 108 is described further in connection with FIG. 13.

Figure 2:
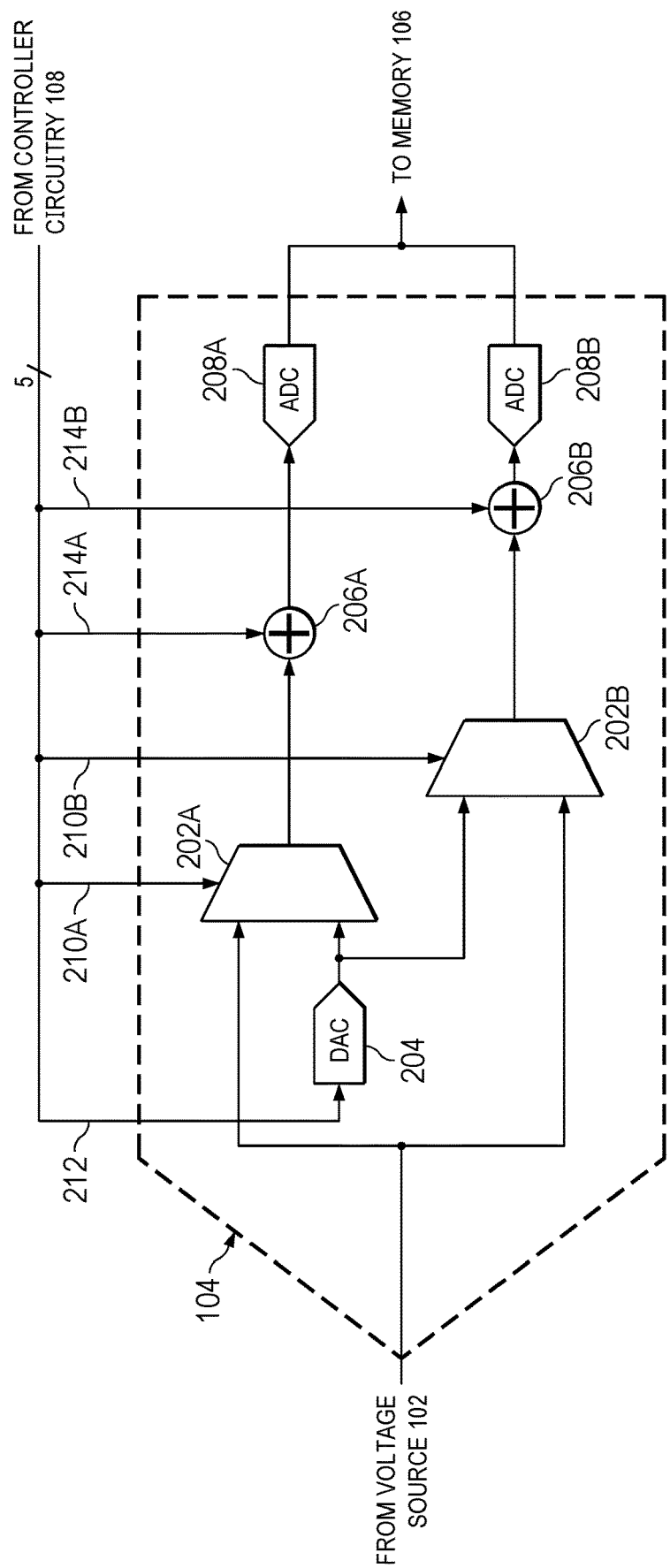
FIG. 2 is a block diagram of an example implementation of the ADC circuitry of FIG. 1.

FIG. 2 is a block diagram of an example implementation of the ADC circuitry of FIG. 1. The ADC circuitry 104 includes an example multiplexer circuitry 202A, 202B (collectively referred to as multiplexer circuits 202), example Digital to Analog Converter (DAC) circuitry 204, example adder circuits 206A, 206B, an example ADC circuitry 208A, 208B (collectively referred to as ADC circuits 208), example select signals 210A, 210B, an example calibration signal 212, and example dither signals 214A, 214B.

The multiplexer circuits 202 receive a first input from the voltage source 102 and a second input from the DAC circuitry 204. The multiplexer circuitry 202A, 202B outputs either the first input or the second input based on the select signals 210A, 210B, respectively. The select signals 210A, 210B are controls signals provided by the controller circuitry 108. In examples described herein, the select signals 210A, 210B match such that, at any point in time, both multiplexer circuits 202 are producing an output based on the voltage source 102 or both multiplexer circuits 202 produce an output based on the DAC circuitry 204. In other examples, the select signals 210A, 210B cause the multiplexer circuits 202 to produce different outputs for some periods.

As used herein, mission mode refers to when at least one of the multiplexer circuits 202 is producing an output based on the voltage source 102. In contrast, calibration mode refers to when at least one of the multiplexer circuits 202 are producing an output based on the DAC circuitry 204.

The DAC circuitry 204 converts the calibration signal 212 into an analog signal. The calibration signal 212 is a digital signal provided by the controller circuitry 108 for use during calibration mode. The DAC circuitry 204 may be implemented by any type of digital to analog converter circuit architecture. Some implementations of parallel ADC architectures do not include a way to provide a known signal to the ADC circuits 208 (e.g., do not implement the DAC circuitry 204). In such implementations, calibration mode is not supported.

The adder circuit 206A adds the output of the multiplexer circuitry 202A to the dither signal 214A. Similarly, the adder circuit 206B adds the output of the multiplexer circuitry 202B to the dither signal 214B. The dither signals 214A, 214B are analog signals provided by the controller circuitry 108 for use during mission mode. In some examples, the dither signal 214A is referred to as intentionally applied noise.

The ADC circuitry 208A, 208B convert the sums of the adder circuits 206A, 206B, respectively to digital signals (i.e., logical bits) that are stored in the memory 106. Accordingly, both of the ADC circuits 208 have: an input terminal configured to receive signals from both the controller circuitry 108 and the voltage source 102. The ADC circuits 208 may be implemented by any ADC used in a parallel ADC architecture. Example implementations of the ADC circuits 208 include but are not limited to folding interpolation ADCs (a category including delay domain ADCs, voltage domain ADCs, etc.), manually averaged ADCs, etc.

In some examples, when not estimating offset and/or gain error, the controller circuitry 108 may place one of the ADC circuits 208 in calibration mode and place the other ADC circuit in mission mode. To place an ADC circuit in calibration mode, the controller circuitry 108 provides a select signals 210A or 210B such that one of multiplexer circuits 202 outputs an analog signal based on the DAC circuitry 204 and the calibration signal 212. The controller circuitry 108 measures the non-linear transfer function of one of the ADC circuits 208 during calibration mode. The controller circuitry 108 may additionally adjust ADC outputs made during mission mode using the non-linear transfer functions measured during calibration mode.

To measure offset and/or gain error, the controller circuitry 108 places both ADC circuits 208 in mission mode at the same time. To do so, the controller circuitry 108 provides the select signals 210A, 210B such that both multiplexer circuits 202 outputs the analog input signal from the voltage source 102. The ADC circuits 208 produce duplicate sets of digital bits that can be compared by the controller circuitry 108 to improve the signal to noise (SnR) ratio. The controller circuitry 108 also provides various nonzero voltages to both dither signals 214A, 214B during parts of the mission mode. By providing different dither signal values to the ADC circuits 208 within a single mission mode period, and by using both ADCs in mission mode at the same time, the example controller circuitry 108 creates a system of equations that can estimate both offset errors and gain errors. As a result, the controller circuitry 108 and ADC circuitry 104 form a parallel ADC architecture that are more accurate than other solutions.

FIG. 2 shows one example implementation of the ADC circuitry 104. In some examples, the ADC circuitry 104 includes other implementations in which at least two ADC circuits can both receive inputs from the voltage source 102 and the controller circuitry 108. For example, rather than two adder circuits 206A, 206B, a single DAC circuit 204, and a single calibration signal 212 as shown in FIG. 2, the ADC circuitry 104 may include two DAC circuits that each receive different calibration signals 212. The ADC circuitry 104 may additionally or alternatively more than two parallel ADC circuits 208.

Figure 3A:
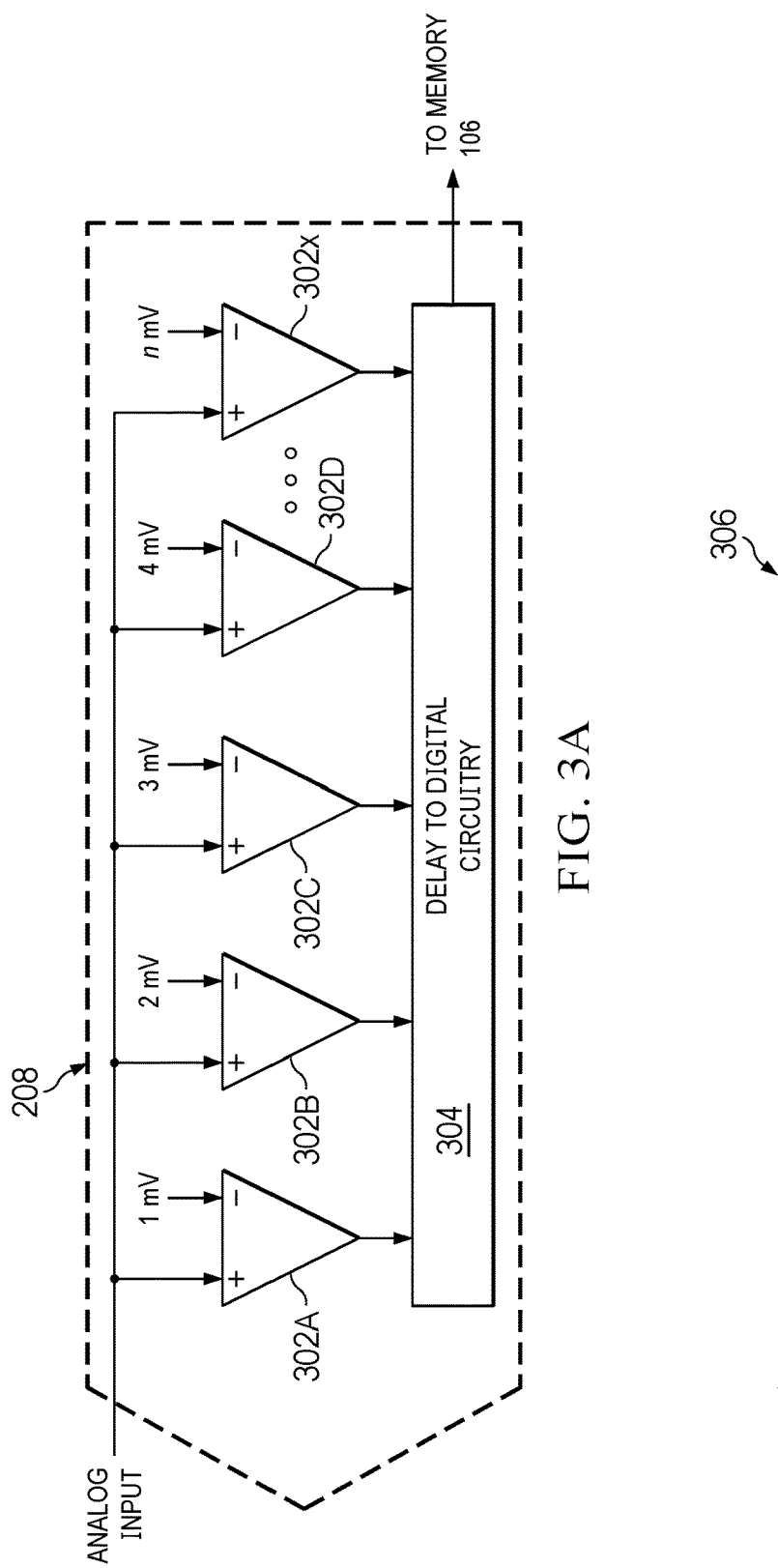
FIG. 3A is a block diagram showing an example implementation of the internal ADC circuits of FIG. 2.

FIG. 3A is a block diagram showing an example implementation of the ADC circuits 208. The ADC circuitry 208B includes comparator circuits 302A, 302B, . . . 302x (collectively referred to as comparator circuits 302) and delay to digital circuitry 304.

In examples described herein, both ADC circuits 208 implement a type of folding interpolation architecture that may be referred to as delay-domain ADCs. Accordingly, the ADC circuits 208 include voltage to delay circuitry and delay to digital circuitry 304. The voltage to delay circuitry can be logically represented as the set of comparators 302. Each of the comparators 302 produces a delay signal by subtracting a threshold voltage from the analog input (e.g., one of the adder circuits 206A, 206B). Each of the comparators 302 uses a different threshold voltage obtained from a known reference signal (e.g., a VDD signal). In the example of FIG. 3A, the comparator 302A uses a threshold voltage of 1 mV, comparator circuit 302B uses a threshold voltage of 2 mV . . . , and the comparator 302x uses a threshold voltage of n mV. In practice, the number of comparators, the threshold voltage values, and the difference between adjacent threshold voltages may vary based on the accepted input range and step size of the ADC circuits 208. The delay to digital circuitry 304 then produces the digital bits based on the delay signals produced by the comparators 302.

Figure 3B:
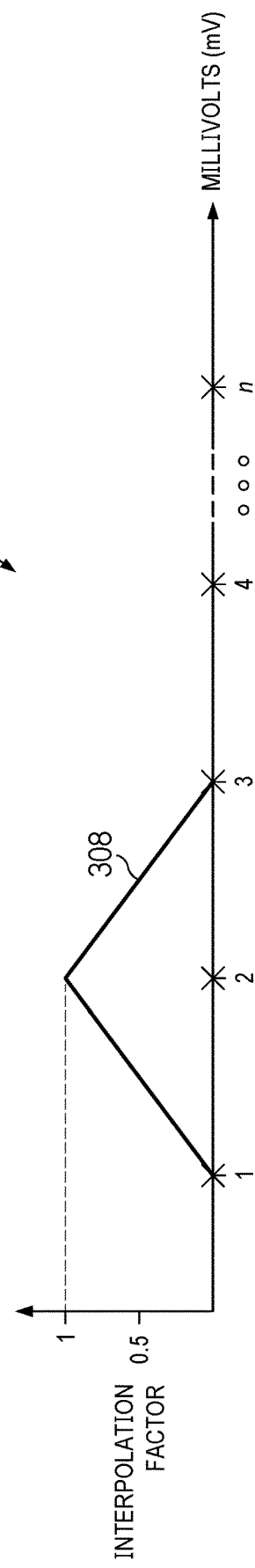
FIG. 3B is a graph illustrating an example offset error of a comparator of the ADC circuit of FIG. 3A.

FIG. 3B is a graph illustrating an example offset error of a comparator of the ADC circuit of FIG. 3A. The example graph 306 includes a signal 308.

The output of either of the ADC circuits 208 can be characterized using equation (1):

$$y_i[n] = x[n] + \text{offset}[i, j] * IF_j + \text{offset}[i, j+1] * IF_{j+1} + \text{thermal noise} \quad (1)$$

In equation 1, i is an index of the ADC (e.g., i=0 refers to ADC circuitry 208A and i=1 refers to ADC circuitry 208B) and x[n] refers to the analog input signal provided by one of the multiplexer circuits 202. Similarly, $y_i[n]$ refers to digital output of the ith index in the ADC circuits 208. The variable j in equation 1 is an index that tracks the comparators (e.g., j=0 refers to comparator 302A, j=1 refers to comparator circuit 302B, etc.) The function offset[i, j] refers to the offset produced by a particular comparator within a particular ADC. As used herein, the offset function may additionally or alternatively be indexed using the reference numerals introduced above (as opposed to the integer values i and j). For example, offset[208B, 302A] refers to the offset error produced by comparator 302A of ADC circuitry 208B. Finally, thermal noise refers to the difference in voltage caused by temperature variation within the ith index in the ADC circuits 208.

For a given voltage provided in the analog input, the delay to digital circuitry 304 produces a digital voltage based on two comparators. For example, suppose the analog input voltage is 2.5 mV. In such an example, the comparator circuit 302B produces a positive delay signal while the comparator 302C produces a negative signal. The delay to digital circuitry 304 would then compare the magnitude of the delay signals produced by the comparator circuits 302B, 302C to determine interpolation factors (IF) and interpolate between the [2 mV, 3 mV] thresholds. In the foregoing example where the voltage is 2.5 mV, both $IF_j$ and $IF_{j+1}$ would equal 0.5 because 2 mV(0.5)+3 mV(0.5)=2.5 mV.

More generally, the delay to digital circuitry 304 attempts to choose interpolation factors to satisfy equation (2):

$$(\text{threshold\_voltage}_j * IF_j) + (\text{threshold}_{\text{voltage}_{j+1}} * IF_{j+1}) = \quad (2)$$

analog input (mV)

In both equation 1 and equation 2, j refers to a specific comparator, $IF_j$ refers to the interpolation factor of the specific comparator, and $IF_{j+1}$ refers to the interpolation factor of the subsequent comparator. In FIG. 3B, the signal 308 provides an example of how the value $IF_j$ or $IF_{j+1}$ changes when one of the two comparators is comparator circuit 302B. For example, if the analog input voltage is near 2.0 V, then j refers to the comparator circuit 302B, $IF_j \approx 1$, and $IF_{j+1} \approx 0$ such that 2 mV(1)+3 mV(0)=2.0 mV. If the analog input voltage is near 2.5 mV, then j refers to the comparator circuit 302B, $IF_j \approx 0.5$, and $IF_{j+1} \approx 0.5$ as described above. Similarly, if the analog input voltage is near 3.0 mV, then j refers to the comparator circuit 302B, $IF_j \approx 0$, and $IF_{j+1} \approx 1$ such that 2 mV(0)+3 mV(1)=3.0 mV. The foregoing examples use approximate values ($\approx$) of $IF_j$ and $IF_{j+1}$ because the interpolation factors may be any value on the continuous spectrum between [0, 1].

While the foregoing examples described use cases where the analog input voltage is between [2 mV, 3 mV), the interpolation factor of the comparator circuit 302B would be used to convert analog signals where the input voltage is between [1 mV, 2 mV). In such examples, j may refer to the comparator 302A and j+1 may refer to the comparator circuit 302B. The example graph 306 shows that, regardless of whether the analog voltage is above or below a particular threshold (e.g., 2 mV), the interpolation factor of the threshold decreases linearly as the delay signals indicate the analog input voltage is closer to one of the adjacent comparator thresholds (e.g., 1 mV or 3 mV). During mission mode, the example controller circuitry 108 leverages the interpolation factors of adjacent comparators to construct a system of equations and correct harmonic distortion as described further in connection with FIGS. 4A-10.

Figure 4A:
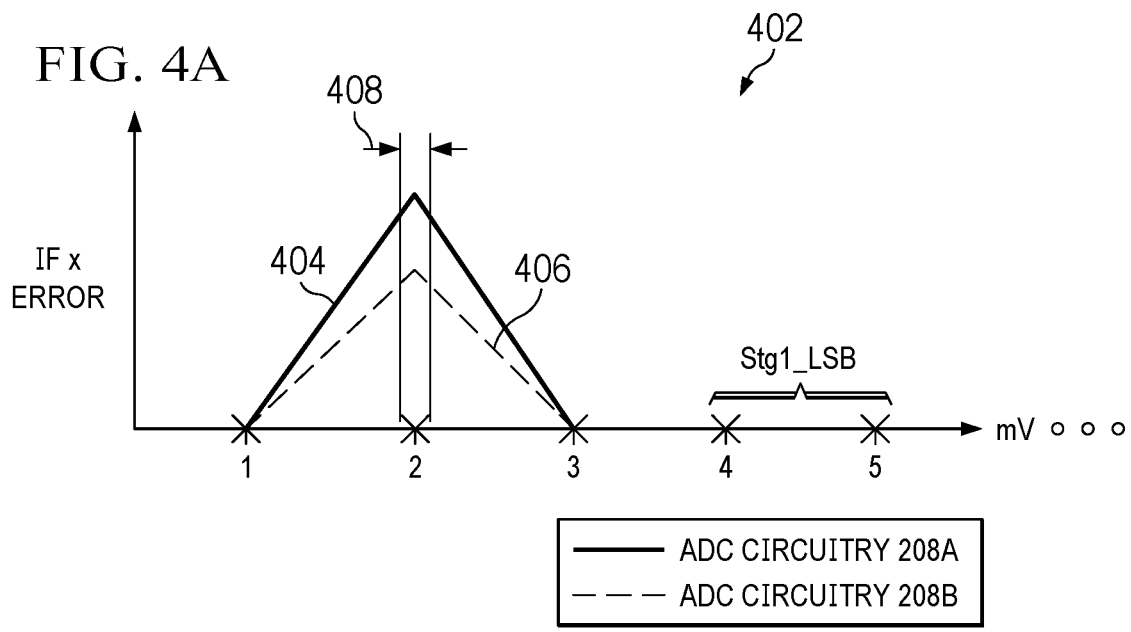
FIG. 4A is a graph illustrating an example offset error of both internal ADC circuits of FIG. 2 when no dither value is applied.

FIG. 4A is a graph illustrating an example offset error of both ADCs circuit of FIG. 2 when no difference in is applied between dither values. The example graph 402 of FIG. 4A includes example signals 404, 406 and an example region 408.

The x axis of FIG. 4A shows the threshold voltages corresponding to the comparators 302. While examples above and herein use threshold voltages of 1 mV increments for simplicity, in practice, other threshold voltage values and increments may be employed. In FIG. 4 and examples used herein, the voltage between comparator thresholds is referred to the as the Stage 1 least significant bit (Stg1_LSB).

The y axis of FIG. 4A shows the product of a given comparator's interpolation factor and error. The y axis of FIG. 4A does not comparator error by itself because the significance of any one comparator error will depend on the interpolation factors and the value of the analog input voltage.

The graph 402 shows an example implementation of signals produced by the ADC circuits 208 when $\text{dither}_{214A}-\text{dither}_{214B}=0$ V during mission mode. The signal 404 shows the error attributable to comparator circuit 302B of the ADC circuitry 208A without an effect from the dither signal 214A. Similarly, the signal 406 shows the error attributable to comparator circuit 302B of the ADC circuitry 208B.

Suppose that, during the period of the mission mode when $\text{dither}_{214A}-\text{dither}_{214B}=0$ V, the voltage source 102 provides an analog input signal of x[n]=2 mV. In such examples, j of equation 1 refers to the comparator circuit 302B, $\text{IF}_j=1$, and $\text{IF}_{j+1}=0$ as described above. Accordingly, equation (1) reduces to equation (3) when i refers to ADC circuitry 208A:

$$y_{208A}[n] = 2 \text{ mV} + \text{offset}[208A, 302B] \quad (3)$$

Similarly, equation (1) reduces to equation (4) when i refers to ADC circuitry 208B:

$$y_{208B}[n] = 2 \text{ mV} + \text{offset}[208B, 302B] \quad (4)$$

After providing the foregoing signal values and measuring the outputs $y_{208A}[n]$ and $y_{208B}[n]$, the controller circuitry 108 can subtract equation (3) from equation (4) to produce equation (5):

$$y_{208B}[n] - y_{208A}[n] = \text{offset}[208B, 302B] - \text{offset}[208A, 302B] \quad (5)$$

Equation (5) describes the difference in offset error between the comparator circuit 302B of ADC circuitry 208A and comparator circuit 302B of ADC circuitry 208B. In the example of FIG. 4A, the signals 404, 406 show that offset [208A, 302B]>offset[208B, 302B], resulting in a nonzero value of equation (5) and harmonic distortion when the two output signals are analyzed together.

The controller circuitry 108 may use equation (5) to describe the error of any input signal provided by the voltage source 102 within the region 408. The controller circuitry 108 may change the width of the region 408 to adjust both the speed and accuracy of an error correction technique, which are inversely related. For example, a comparatively narrow range of values in the region 408 would result in estimated error values that are more accurate than a comparatively wide range. However, the controller circuitry 108 can estimate errors using the comparatively wide range in less time than the controller can complete the same estimations using the comparatively narrow range. Accordingly, the controller circuitry 108 may determine the width of the region 408 based on how a particular use case wishes to balance the competing factors of accuracy and speed. In some examples, the controller circuitry 108 determines the width of the region 408 based on instructions from the application 110.

The relationship of equation (5) is described more generally by equation (6):

$$y_{i+1}[n] - y_i[n] = \text{offset}[i+1, j] - \text{offset}[i, j] \quad (6)$$

The controller circuitry 108 can use equation (6), each formed with $\text{dither}_{214A}-\text{dither}_{214B}=0$ V, to generate n−1 equations that describe the n comparators 302.

Figure 4B:
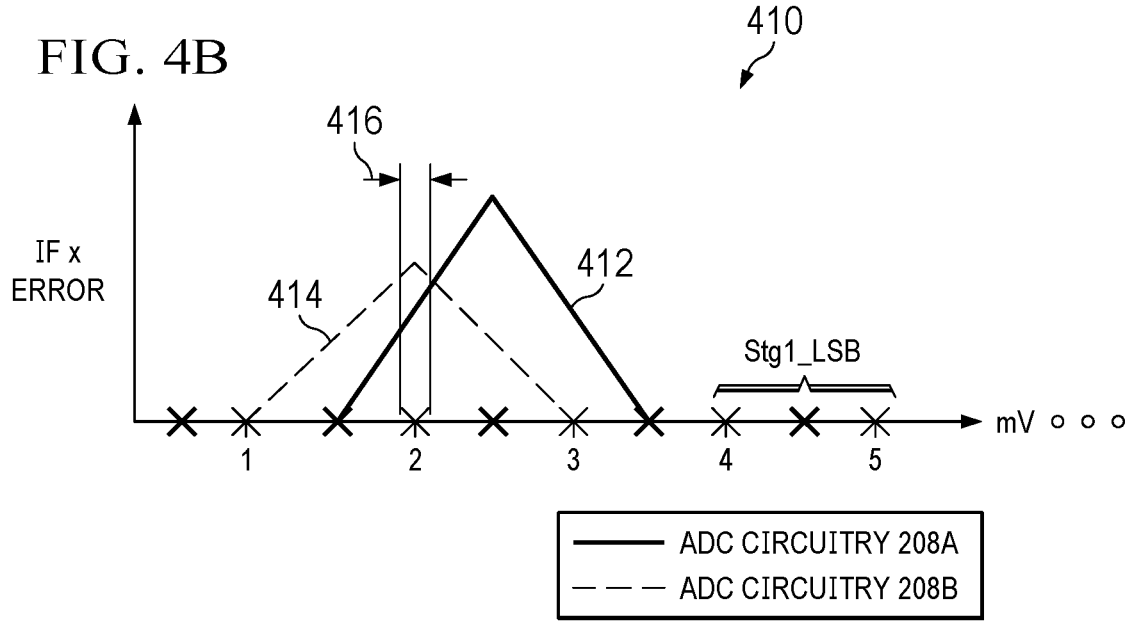
FIG. 4B is a graph illustrating an example offset error of both internal ADC circuits of FIG. 2 when a first dither value is applied.

FIG. 4B is a graph illustrating an example offset error of both ADC circuits of FIG. 2 when a first offset is applied. The example graph 410 of FIG. 4B includes example signals 412, 414, and an example region 416.

Like FIG. 4A, the x axis of FIG. 4B shows the threshold voltages corresponding to the comparators 302 and the y axis shows the product of a given comparator's interpolation factor and error. Also like FIG. 4A, the voltage source 102 provides an analog input signal of x[n]=2 mV during FIG. 4B. However, while the graph 402 shows signals where $\text{dither}_{214A}-\text{dither}_{214B}=0$ V, the controller circuitry 108 provides a dither signal 214A in the graph 410 equal to one half of the stage 1 LSB (i.e., $\text{dither}_{214A}-\text{dither}_{214B}=\text{Stg1\_LSB}/2$). In examples described above and herein, $\text{Stg1}_{LSB}=1$ mV so $\text{dither}_{214A}-\text{dither}_{214B}=0.5$ mV for the graph 410. In other examples, Stg1_LSB refers to a different value.

The Stg1_LSB/2 difference in signal dither signals is provided to the adder circuitry 206, which affects only the ADC circuitry 208A. Accordingly, the signal 412, which shows the error attributable to comparator circuit 302B of the ADC circuitry 208A, is a version of the signal 404 that has been shifted by 0.5 mV. Under such circumstances, j of equation 1 refers to the comparator circuit 302B, $\text{IF}_j=0.5$, and $\text{IF}_{j+1}=0.5$ because both the 2 mV and 3 mV thresholds are equidistant from the 2.5 mV analog voltage provided to the ADC circuitry 208A. Accordingly, equation (1) reduces to equation (7) when i refers to ADC circuitry 208A:

$$y_{208A}[n] = 2.5 \text{ mV} + \text{offset}[208A, 302B]*0.5 + \text{offset}[208A, 302C]*0.5 \quad (7)$$

The relative difference in dither signals does not affect the ADC circuitry 208B, so the signal 412 matches the signal 406 in both phase and magnitude. Accordingly, the output of the ADC circuitry 208B when $\text{dither}_{214A}-\text{dither}_{214B}=\text{Stg1\_LSB}/2$ can be described using equation (4) as described above.

After providing the foregoing signal values and measuring the outputs $y_{208A}[n]$ and $y_{208B}[n]$, the controller circuitry 108 can subtract equation (7) from equation (4) to produce equation (8):

$$y_{208B}[n] - y_{208A}[n] = \text{offset}[208B, 302B] - \\ 0.5(\text{offset}[208A, 302B] + \text{offset}[208A, 302C]) - 0.5 \text{ mV} \quad (8)$$

The relationship of equation (8) is described more generally by equation (9):

$$y_{i+1}[n] - y_i[n] = \\ \text{offset}[i+1, j] - \frac{(\text{offset}[i, j] + \text{offset}[i, j+1])}{2} - \left(\frac{\text{Stg1}_{LSB}}{2}\right) \quad (9)$$

The controller circuitry 108 can use equation (9), each formed with dither$_{214A}$–dither$_{214B}$=Stg1_LSB/2, to generate n−1 equations that describe the n comparators 302.

Because both equation (6) and equation (9) describe $y_{i+1}$[n]−$y_i$[n], the controller circuitry 108 subtracts equation from (9) equation (6) as described in equation (10):

$$(y_{i+1}[n] - y_i[n])_{(6)} - (y_{i+1}[n] - y_i[n])_{(9)} = \frac{(\text{offset}[i, j] - \text{offset}[i, j+1])}{2} + \frac{Stg1_{LSB}}{2} \quad (10)$$

Equation 10 describes the difference in offsets between the comparator circuits 302B, 302C within the ADC circuitry 208A. The controller circuitry 108 then repeats the process described in connection to equations (1) through (10) but with x[n]=3 mV and j of equation 1 referring to the comparator circuit 302C. The result of such operations produces a version of equation (10) that describes the difference in offsets between 302C, 302D within the ADC circuitry 208A.

By repeating the process described in connection to equations (1) through (10), the controller circuitry 108 can generate n−1 equations that each describe difference in offset error between two consecutive comparators. The n−1 equations have a total of n variables, so the controller circuitry 108 sets one of the comparator offsets (e.g., comparator 302x) to zero and solves the remaining n−1 variables via a system of equations. The controller circuitry 108 does not need to determine the actual offset error of comparator 302x because the offset errors of comparators 302A, 302B, . . . , 302(x−1) are all determined with the presumption that offset error of comparator 302x=0 V. In such scenarios, the offset error of comparator 302x can be modeled as a DC offset that does not cause harmonic distortion.

Furthermore, by providing dither$_{214B}$>dither$_{214A}$ rather than dither$_{214A}$>dither$_{214B}$ as described above, the controller circuitry 108 can repeat the process described in connection with FIG. 4B for the ADC circuitry 208B rather than the ADC circuitry 208A. The n−1 variables characterize the offset error of the comparators 302. Accordingly, the controller circuitry 108 uses the solution of the system of equations to correct for the harmonic distortion caused by offset error in digital outputs produced during mission mode.

In practice, an additional thermal noise term can be added to each of equations (2) through (10). The thermal noise terms cannot be cancelled from any equation because thermal noise is uncorrelated between any two comparators. However, the controller circuitry 108 can average out the thermal noise and converge on values of the n comparator offsets given enough iterations of equations (6) and (9).

If the region 408 is narrow and only includes a small range of values above or below the comparator threshold, some ADC outputs produced when dither$_{214A}$−dither$_{214B}$=0 V would not be used to measure error. For example, suppose the region 408 is between [1.9 mV, 2.1 mV]. If the voltage source 102 provided an analog input voltage of 2.25 mV, the controller circuitry 108 would not use the voltage to form an iteration of the system of equations.

Advantageously, the controller circuitry 108 can use a region 408 having a width of a full ADC step size (e.g., the region 408 is centered on a comparator threshold voltage and extends±(STG1_LSB/2)). Using a wide region 408 does increase the chance that an input voltage is less representative of an interpolation factor (e.g., a range between [1.5 mV, 2.5 mV] allows a theoretical 1.51 mV input to be assigned IF$_j$=1 with a 2.0 mV comparator threshold, while a range between [1.9 mV and 2.1 mV] would prevent such an assignment). However, while converging on a solution over multiple iterations of the system of equations, the controller circuitry 108 implements a negative feedback loop to correct for the variance in interpolation factors. Furthermore, the controller circuitry 108 can use any analog input received during mission mode to form a system of equations, regardless of the variation in the unknown signal generated by the voltage source 102. As a result, the controller circuitry 108 can average out thermal noise and converge on offset error values quickly enough to track high frequency noise (e.g., flicker noise above 100 Hertz).

Figure 5:
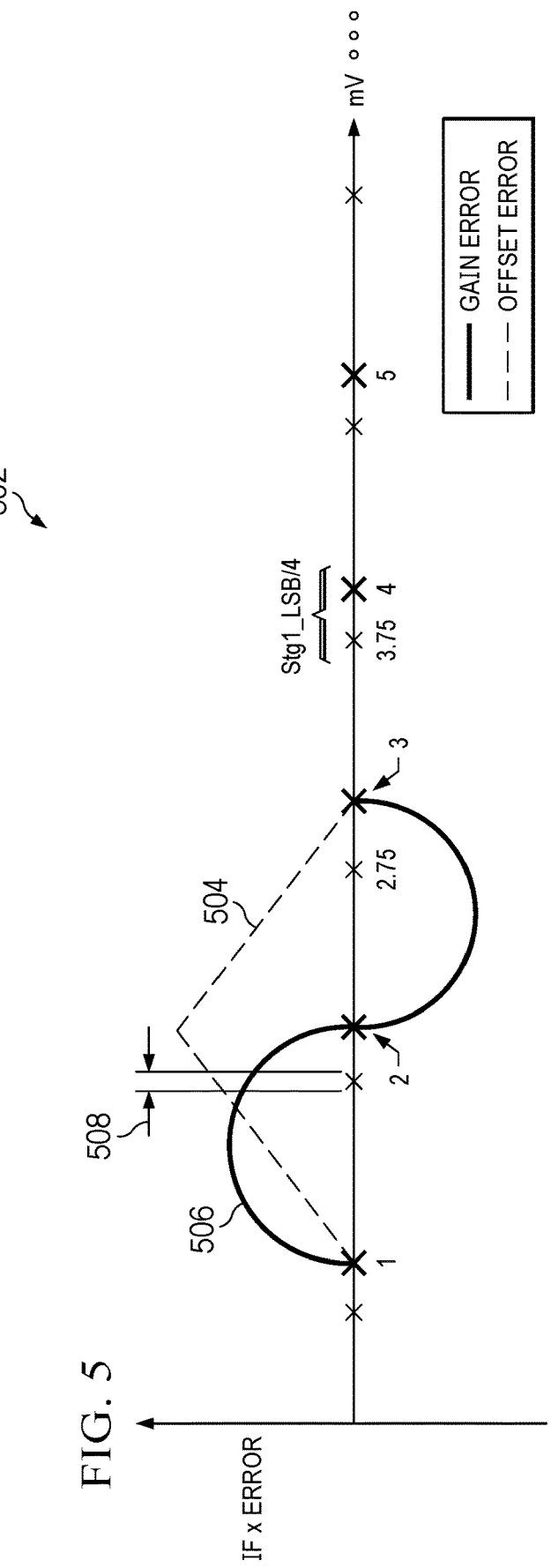
FIG. 5 is a graph illustrating an example offset error and an example gain error of an internal ADC circuit of FIG. 2.

FIG. 5 is a graph illustrating an example offset error and an example gain error of an ADC circuit of FIG. 3A. The graph 502 of FIG. 5 includes example signals 504, 506, and an example range 508.

Like FIGS. 4A and 4B, the x axis of graph 502 shows the threshold voltages corresponding to the comparators 302 (e.g., 1 mV, 2 mV . . . , n mV). The y axis of the graph 502 shows the interpolation factor.

The signal 504 represents the interpolation factor of gain error in the comparator circuit 302B. The signal 504 shows that, as described above, offset error has a linear interpolation factor. Accordingly, if the interpolation factor decreases linearly between the comparator threshold voltage (e.g., 2 mV) and the adjacent comparator threshold voltages (e.g., 1 mV and 3 mV).

The signal 506 shows the interpolation factor of gain error in the comparator circuit 302B. As used herein, gain error refers to the difference in gains between two adjacent comparators. The signal 506 is a second order (e.g., quadratic) function because, in a folding interpolation architecture, the constant offset terms are integrated to become linear terms and the linear gain term are integrated to become quadratic terms. More generally, the controller circuitry 108 can estimate any zth order polynomial error in the ADC circuits 208 that becomes integrated to a (z+1)th order after interpolation.

When considering the difference in gain between comparators, the output of an ADC can be characterized as described in equation (11):

$$y_i[n] = x[n] + \text{offset}[i, j] * IF_j + \text{offset}[i, j+1] * IF_{j+1} + \quad (11)$$
$$(ge[i, j] - ge[i, j+1]) * (IF_q^2) + \text{thermal noise}$$

Equation (11) introduces terms ge[i, j], ge[i, j+1], and IF$_q$ that were not present in equation (1). As used herein, ge[i, j] refers to the jth comparator in the ith index of the ADC circuits 208. Similarly, ge[i, j+1] refers to the j+1th comparator in the ith index of the ADC circuits 208. IF$_q$ refers to the interpolation factor of the gain error, which is characterized by a quadratic function. In some examples, IF$_q$ is referred to as a second order interpolation factor.

In the foregoing examples of FIGS. 4A and 4B, the controller circuitry 108 uses two different dither states (dither$_{214A}$−dither$_{214B}$=0 V and dither$_{214A}$−dither$_{214B}$=Stg1_LSB/2) to form two equations (equation (6) and equation (9)) used in a feedback loop. The controller circuitry 108 uses the equations of FIGS. 4A and 4B to compute errors that change quickly in time, including but not limited to as flicker noise over 100 Hz.

To solve for gain error, the controller circuitry 108 introduces an additional dither state, and a new system of equations. In examples described herein, the controller circuitry 108 uses dither$_{214A}$–dither$_{214B}$=Stg1_LSB/4 as the additional dither state. In other examples, the additional dither state is a different, nonzero solution to dither$_{214A}$–dither$_{214B}$. By providing each of the three dither states sequentially, computing equation (11) for each of the ADC circuits 208 and determining the difference in outputs, the controller circuitry 108 determines equations (12), (13), and (14):

$$y_{i+1}[n] - y_i[n] = \text{offset}[i+1, j] - \text{offset}[i, j] \quad (12)$$

$$y_{i+1}[n] - y_i[n] = \text{offset}[i+1, j] - \frac{(\text{offset}[i, j] + \text{offset}[i, j+1])}{2} - \left(\frac{Stg1_{LSB}}{2}\right) - (\Delta ge * 1.28) \quad (13)$$

$$y_{i+1}[n] - y_i[n] = \text{offset}[i+1, j] - \frac{(3*\text{offset}[i, j] + \text{offset}[i, j+1])}{4} - \left(\frac{Stg1_{LSB}}{4}\right) - (\Delta ge * 0.92) \quad (14)$$

The controller circuitry 108 determines equation (12) when dither$_{214A}$–dither$_{214B}$=0 V. In such a situation, the gain error terms cancel, and equation (12) is an exact match of equation (6) as described above.

The controller circuitry 108 determines equation (13) when dither$_{214A}$–dither$_{214B}$=Stg1_LSB/2. Accordingly, equation (13) is a modified version of equation (10). The controller circuitry 108 determines equation (14) when dither$_{214A}$–dither$_{214B}$=Stg1_LSB/4, and equation (14) is also a modified version of equation (10). In equations (13) and (14), Δge refers to the difference in gain between the ge[i, j] and ge[i, j+1].

The controller circuitry 108 uses equations (12), (13) and (14) to construct a system of equations and feedback loop to solve both offset error and gain error. Such a feedback loop cannot account for wide variance in interpolation factors (as shown above when using equations (6) and (9) to solve only for offset error) because the accuracy of scaling factors such as are sensitive to the interpolation factor. For example, while the values 1.28 and 0.92 are accurate when IF$_f$≈1, the values are less accurate when IF$_f$≈0.5. Accordingly, the controller circuitry 108 uses input voltages within the range 508 implementing equations (12), (13), and (14) for comparator 302 with a threshold voltage of 2 mV.

Moreover, the values 1.28 and 0.92 describe the linear gain error (a second order error) of the ADCs 208. If the controller circuitry 108 was estimating a higher order error (e.g., if z>2 as described above), equations (13) and (14) would include different constants.

The controller circuitry 108 may use a smaller set of values to define range 508 than the set of values that defines region 408. Accordingly, the feedback loop that solves both offset error and gain error may converge to a solution slower than the feedback loop that implements only offset error. This slower converge occurs because the gain error described in equations (13) and (14) are static (e.g., the values do not vary notably over time).

Advantageously, the controller circuitry 108 can run both feedback loops described herein in parallel. For example, the controller circuitry 108 may use two of the dither states to solve for only offset error once every 1 millisecond while in mission mode and use all three dither states to solve for offset error and gain error once every 5 milliseconds. As a result, the controller circuitry 108 can track high frequency noise such as flicker noise over 100 Hz while also tracking gain error. While a ratio of 1:5 is used here for simplicity, in practice, the controller circuitry 108 may implement the two feedback loops at a different ratio. In some examples, the controller circuitry 108 runs both feedback loops sequentially.

FIG. 6 is a table describing an example implementation of dither signals provided to the internal ADC circuits of FIG. 2. The example table 600 includes a first column describing various states of the controller circuitry, a second column describing the value of the dither signal 214A, a third column describing the value of the dither signal 214B, and a fourth column describing. In FIG. 6, STG1_LSB is referred to as SL for simplicity.

The controller circuitry 108 may provide one of eight values in the dither signal 214A or dither signal 214B:

$$\pm\left[(SL)\left(\frac{1}{8}\right)\right], \pm\left[(SL)\left(\frac{3}{8}\right)\right], \pm\left[(SL)\left(\frac{5}{8}\right)\right], \text{ and } \pm\left[(SL)\left(\frac{7}{8}\right)\right].$$

While some parallel ADC architectures provided uncorrelated dither signals to ADCs, the controller circuitry 108 correlates the dither signals 214A and 214B so that dither$_{214A}$–dither$_{214B}$ can be used to solve both feedback loops for high frequency noise and gain error.

The table 600 shows how the controller circuitry 108 may operate in any of the states with a most significant bit (MSB) of 0 to achieve dither$_{214A}$–dither$_{214B}$=0 V. The equal dither signals are used during mission mode as described above in connection with FIG. 4A, equation (6) and equation (12).

The controller circuitry 108 may operates in any of states numbered 1000, 1010, 1100, or 1110 to achieve (dither$_{214A}$–dither$_{214B}$)=±LS/2. A shift of dither signals by one half of the ADC step size is used during mission mode as described above in connection with FIG. 4B, equation (9) and equation (13).

The controller circuitry 108 may operate in any of states 1001, 1011, 1101, and 1111 to achieve (dither$_{214A}$–dither$_{214B}$)=±LS/4. A shift of dither signals by one quarter of the ADC step size is used during mission mode as described above in connection with FIG. 5 and equation (14).

While an example manner of implementing the example environment 100 of FIG. 1 is illustrated in FIGS. 2-6, one or more of the elements, processes, and/or devices illustrated in FIGS. 2-6 may be combined, divided, re-arranged, omitted, eliminated, and/or implemented in any other way. Further, the example controller circuitry 108 of FIG. 1 may be implemented by hardware alone or by hardware in combination with software and/or firmware. Thus, for example, any of the example controller circuitry 108 of FIG. 1, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)). ASIC(s), programmable logic device(s) (PLD(s)), and/or field programmable logic device(s) (FPLD(s)) such as FPGAs. Further still, the example controller circuitry 108 of FIG. 1 may include one or more elements, processes, and/or devices in addition to, or instead of, those illustrated in FIGS. 2-6, and/or may include more than one of any or all of the illustrated elements, processes and devices.

Flowchart(s) representative of example machine readable instructions, which may be executed by programmable circuitry to implement and/or instantiate the controller circuitry 108 of FIG. 1 and/or representative of example operations which may be performed by programmable circuitry to implement and/or instantiate the controller circuitry 108 of FIG. 1 are shown in FIGS. 7-10. The machine readable instructions may be one or more executable programs or portion(s) of one or more executable programs for execution by programmable circuitry such as the programmable circuitry 1312 shown in the example programmable circuitry platform 1300 described below in connection with FIG. 13 and/or may be one or more function(s) or portion(s) of functions to be performed by the example programmable circuitry (e.g., an FPGA). In some examples, the machine readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 7-10, many other methods of implementing the example controller circuitry 108 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine readable instructions may be fragmented and stored on one or more storage devices, disks and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable, computer readable and/or machine readable media, as used herein, may include instructions and/or program(s) regardless of the particular format or state of the machine readable instructions and/or program(s).

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 7-10 may be implemented using executable instructions (e.g., computer readable and/or machine readable instructions) stored on one or more non-transitory computer readable and/or machine readable media. As used herein, the terms non-transitory computer readable medium, non-transitory computer readable storage medium, non-transitory machine readable medium, and/or non-transitory machine readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

Figure 7:
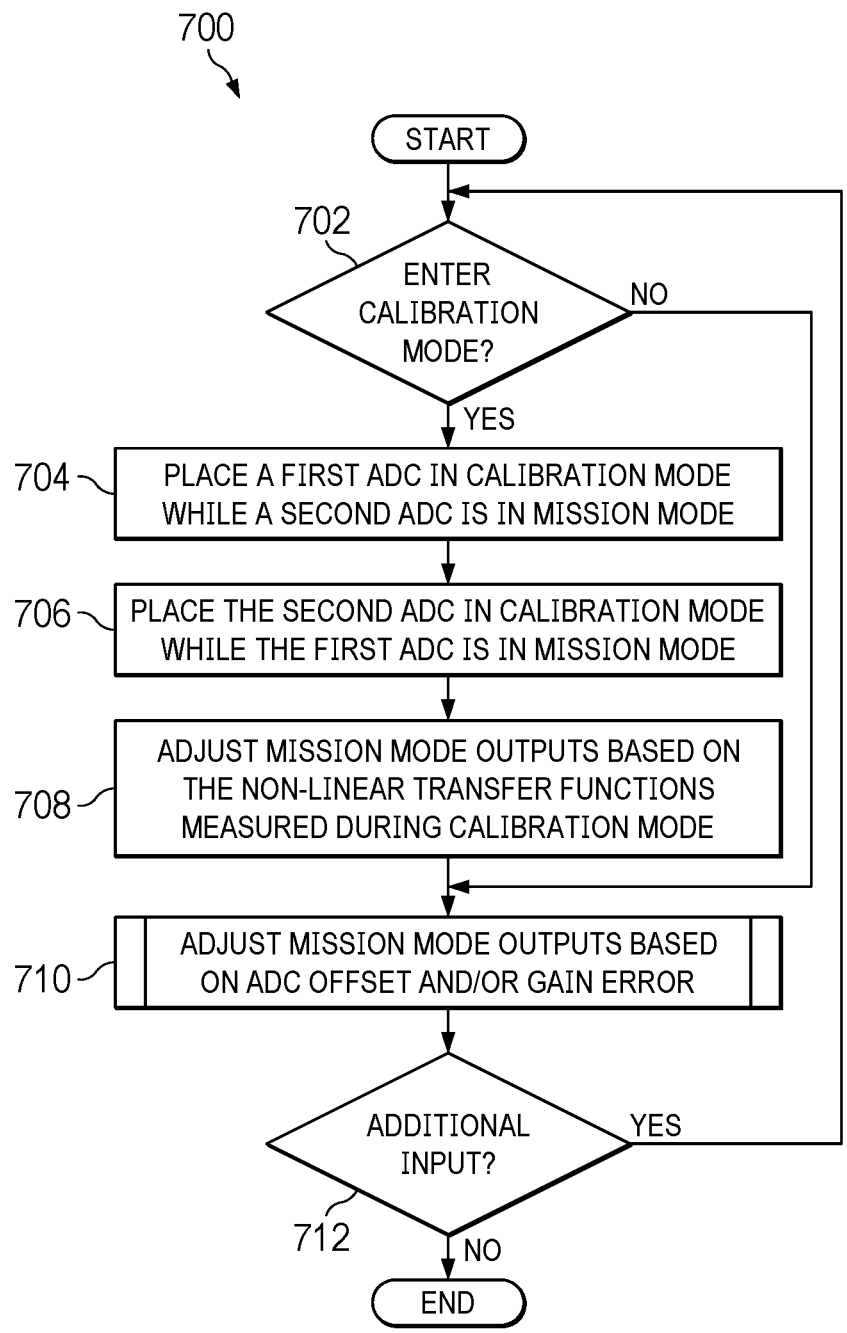
FIG. 7 is a flowchart representative of example machine readable instructions and/or example operations that may be executed, instantiated, and/or performed to implement the ADC circuitry 104.

FIG. 7 is a flowchart representative of example machine readable instructions and/or example operations that may be executed, instantiated, and/or performed to implement the ADC circuitry 104. The example machine readable instructions and/or operations 700 begin when the controller circuitry 108 determines whether to enter calibration mode. (Block 702). In some examples, the ADC circuitry 104 does not include the DAC circuitry 204 and cannot support calibration mode.

If the ADC circuitry 104 does support calibration mode, the controller circuitry 108 may determine to enter calibration mode at any time and for any reason. For example, the controller circuitry 108 may enter calibration mode more frequently in use cases where the ADC circuitry 104 exhibits comparatively high non-linearity than in use cases where the ADC circuitry 104 exhibits comparatively low non-linearity.

If calibration mode is not entered (Block 702: No) due to either a lack of supporting hardware or a decision by the controller circuitry 108, control proceeds to block 712. If calibration mode is entered (Block 702: Yes), the controller circuitry 108 places a first ADC (e.g., ADC circuitry 208A) into calibration mode while a second ADC (e.g., ADC circuitry 208B) is in mission mode. (Block 704). The controller circuitry 108 also measures the non-linear transfer function of the first ADC using known signal(s) from the DAC circuitry 204 during block 704.

The controller circuitry 108 places the second ADC (e.g., ADC circuitry 208B) into calibration mode while the first ADC (e.g., ADC circuitry 208A) is in mission mode. (Block 706). The controller circuitry 108 also measures the non-linear transfer function of the second ADC using known signal(s) from the DAC circuitry 204 during block 706. The controller circuitry 108 then adjusts outputs made by ADCs in mission mode using the non-linear transfer functions obtained during calibration mode. (Block 708).

After block 708, or if calibration mode is not entered (Block 702: No), the controller circuitry 108 adjusts mission mode outputs of the ADC circuits 208 based on the ADC offset and/or gain error. (Block 710). The controller circuitry 108 uses one or more system of equations to adjust for offset and gain error as described by teachings herein. Block 710 is discussed further in connection with FIGS. 8, 9, and 10.

The controller circuitry 108 determines whether there are additional inputs from the voltage source 102. (Block 712). If there are additional inputs from the voltage source 102 (Block 712: Yes), control returns to block 702 where controller circuitry 108 determines if calibration mode is supported and whether to enter calibration mode. The instructions and/or operations 700 end when there are no additional inputs produced by the voltage source 102 (Block 712: No).

Figure 8:
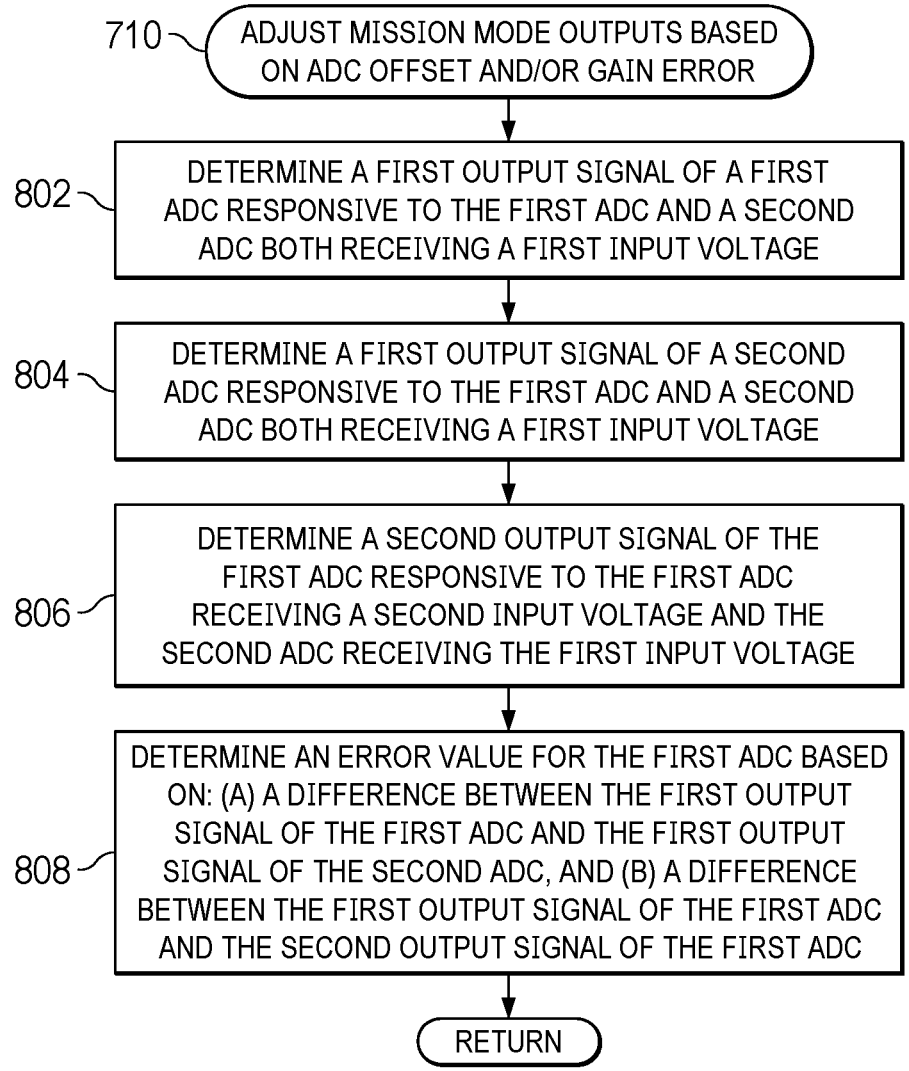
FIG. 8 is a first flowchart representative of example machine readable instructions and/or example operations that may be executed, instantiated, and/or performed using an example programmable circuitry to adjust for offset and/or gain error as described in FIG. 7.

FIG. 8 is a first flowchart representative of example machine readable instructions and/or example operations that may be executed, instantiated, and/or performed using an example programmable circuitry to adjust for offset and/or gain error as described in FIG. 7. In particular, FIG. 8 is an example implementation of block 710 of FIG. 7. Execution of block 710 begins when the controller circuitry 108 determines a first output signal of a first ADC (e.g., the ADC circuitry 208A) responsive to the first ADC and a second ADC (e.g., the ADC circuitry 208B) both receiving a first input voltage. (Block 802). The first input voltage of block 802 is the sum of the signal provided by the voltage source 102 and a dither value provided in both dither signals 214A and 214B. As described in FIG. 6, the dither signals provide the same dither value in any of the states from table 600 with a MSB of 0. The controller circuitry 108 also determines a first output signal of the second ADC responsive to the first ADC and the second ADC both receiving the first input voltage. (Block 804).

The controller circuitry 108 determines a second output signal of the second ADC responsive to the first ADC receiving a second input voltage and the second ADC receiving the first input voltage. (Block 806). The second input voltage is offset from the first input voltage by Stg1_LSB/2. For example, if the controller circuitry 108 operates in state 0000 of the table 600

$$\left(\text{dither}_{214A} = -\left[(SL)\left(\frac{7}{8}\right)\right] \text{ and } \text{dither}_{214B} = -\left[(SL)\left(\frac{7}{8}\right)\right]\right)$$

while implementing blocks 802 and 804, then the controller circuitry 108 transitions to state 1010 of table 600

$$\left(\text{dither}_{214A} = -\left[(SL)\left(\frac{3}{8}\right)\right] \text{ and } \text{dither}_{214B} = -\left[(SL)\left(\frac{7}{8}\right)\right]\right)$$

to implement block 806. The second ADC continues to receive the first input voltage at block 806 so that terms produced in equations (6) and (9) (e.g., offset[i+1, j]) by the presence of the second ADC will cancel in equation (10).

The controller circuitry 108 determines an error value for the first ADC based on: (a) a difference between the first output signal of the first ADC and the first output signal of the second ADC, and (b) a difference between the first output signal of the first ADC and the second output signal of the first ADC. (Block 808). The controller circuitry 108 uses the differences in output signals to form a system of equations based on equations (6) and (9) as described above. Control returns to block 712 after block 808, where the controller circuitry 108 determines whether there are additional inputs from the voltage source 102.

Figure 9:
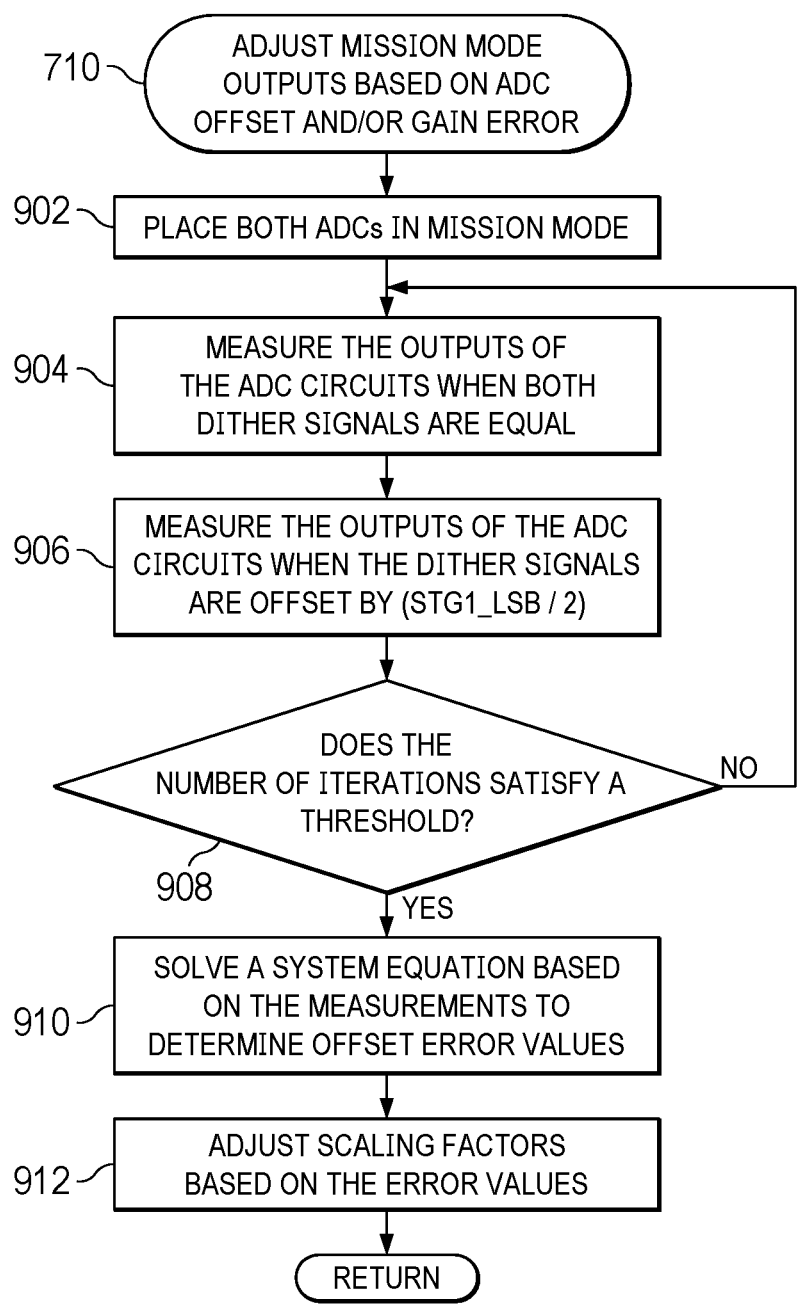
FIG. 9 is a second flowchart representative of example machine readable instructions and/or example operations that may be executed, instantiated, and/or performed using an example programmable circuitry to adjust for offset and/or gain error as described in FIG. 7.

FIG. 9 is a second flowchart representative of example machine readable instructions and/or example operations that may be executed, instantiated, and/or performed using an example programmable circuitry to adjust for offset and/or gain error as described in FIG. 7. In particular, FIG. 9 is an example implementation of block 710 of FIG. 7. Execution of block 710 begin when the controller circuitry 108 places both ADC circuits 208 in mission mode. (Block 902). To enter mission mode, the controller circuitry 108 provides select signals 210A and 210B such that both the multiplexer circuits 202 provide outputs based on the unknown analog signal provided by the voltage source 102.

The controller circuitry 108 measures the outputs of the ADC circuits 208 when both dither signals 214A and 214B are equal. (Block 904). The measurements in block 904 describe the difference in error between the jth comparator of both ADC circuits 208. The controller circuitry 108 uses the measurements of block 904 to determine equation (6) and equation (12) as described above.

The controller circuitry 108 measures the outputs of the ADC circuits 208 when the dither signals 214A and 214B are offset by Stg1_LSB/2. (Block 906). The measurements in block 906 describe the difference in error between the adjacent comparators of an ADC circuitry 208A. The controller circuitry 108 uses the measurements of block 904 to determine both equation (9) and equation (13) as described above. In some examples, the controller circuitry 108 implements block 904 and/or block 906 multiple times within a loop of block 904-908 to measure the difference in adjacent comparator offsets and adjacent comparator gains in both ADC circuits 208.

The controller circuitry 108 determines whether a number of iterations satisfies a threshold. (Block 908). The number of iterations of block 908 refers to the number of times that the controller circuitry 108 produces measurements by implementing blocks 904 and 906. The controller circuitry 108 waits for a threshold number of iterations of equation (6) and equation (9) to be measured before solving a system of equations so that thermal noise can be averaged out. The threshold of block 908 may be a pre-determined value stored in the memory 106. If the number of iterations does not satisfy the threshold (Block 908: No), the controller circuitry 108 measures another output with equal dither signals (Block 904) and another output with dither signals offset by Stg1_LSB/2 (Block 906), thereby incrementing the number of iterations.

If the number of iterations does satisfy the threshold (Block 908: Yes), The controller circuitry 108 solves a system of equations based on the measurements to determine offset error values. (Block 910). The system of equations in block 808 is based on the multiple iterations of equation (6) and equation (9). The controller circuitry 108 uses both the outputs of the ADC circuits 208 and scaling factors to form the system of equations in block 908. Examples of scaling factors include 0.92 and 1.28 in equations (13) and (14). Advantageously, in block 908 of FIG. 9, the error values are more accurate than other parallel ADC implementations because the controller circuitry 108 tracks high frequency offset error.

The controller circuitry 108 adjusts the scaling factors based on the generated error values of block 910 and the range of expected error values. (Block 912). For example, to determine the scaling factor 1.28 in equation (13), the controller circuitry 108 may start with a scaling factor of 0.5, change the scaling factor to 2.0 in a first iteration of block 912, change the scaling factor to 1.0 in a second iteration of block 912, change the scaling factor to 1.5 in a second iteration of block 912, change the scaling factor to 1.25 in a third iteration, and change the scaling factor to 1.26 in a fourth iteration. The change from 0.5→2.0→1.0→1.5→1.25→1.28 is an example implementation of convergence of a scaling factor. In other examples, the controller circuitry 108 converges to a different value over a different number of iterations.

By adjusting scaling factors, the controller circuitry 108 increases the accuracy of error values that use the modified scaling factors in future iterations of block 910. During block 912, the controller circuitry 108 may additionally correct ADC outputs made mission mode using the error values of block 910. Control returns to block 712 after block 912, where the controller circuitry 108 determines whether there are additional inputs from the voltage source 102.

Figure 10:
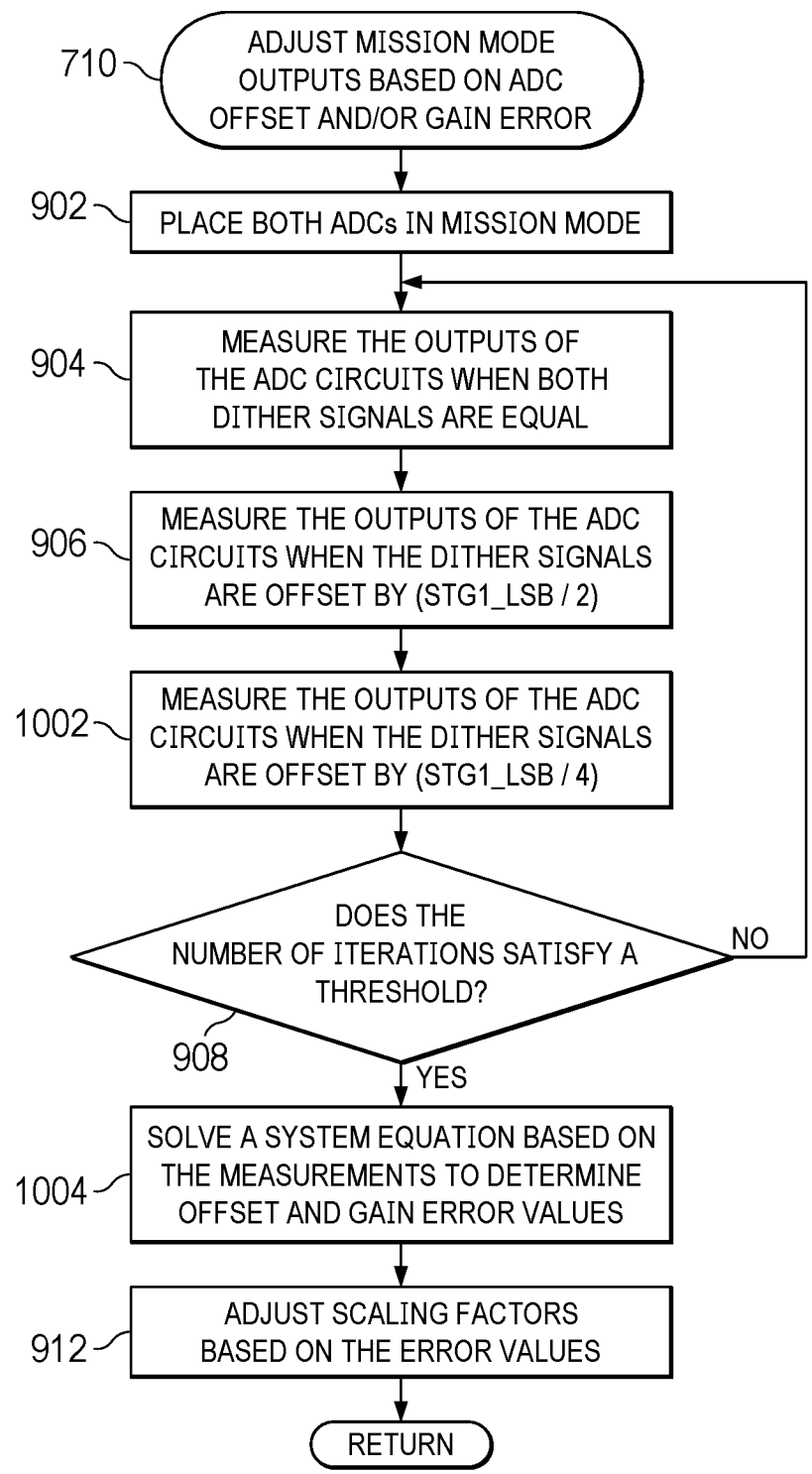
FIG. 10 is a third flowchart representative of example machine readable instructions and/or example operations that may be executed, instantiated, and/or performed using an example programmable circuitry to adjust for offset and/or gain error as described in FIG. 7.

FIG. 10 is a third flowchart representative of example machine readable instructions and/or example operations 1000 that may be executed, instantiated, and/or performed by programmable circuitry to adjust for offset and/or gain error as described in FIG. 7. In particular, FIG. 10 is an example implementation of block 710 of FIG. 7. FIG. 10 includes the example blocks 902-906 of FIG. 9, example blocks 1002, 1004, and the example blocks 908, 912 of FIG. 9.

In the flowchart of FIG. 10, the controller circuitry 108 implements blocks 902-906, block 908, and block 912 as described above in connection with FIG. 9. However, after block 906 in the flowchart of FIG. 10, the controller circuitry 108 measures the outputs of the ADC circuits 208 when the dither signals 214A and 214B are offset by Stg1_LSB/4. (Block 1002). The measurements in block 1002 describe the difference in gain error between adjacent comparators of an ADC circuitry 208A. The controller circuitry 108 uses the measurement of block 1002 to determine equation (14) as described above. Control returns to block 908 after block 1002.

In the flowchart of FIG. 10, if the number of iterations does satisfy the threshold (Block 908: Yes), the controller circuitry 108 solves a system of equations based on the measurements to determine offset error values and gain error values. (Block 1004). The system of equations in block 1004 is based on equations (12), (13), and (14). Control returns to block 912 after block 1004. Advantageously, in block 1004 of FIG. 10, the error values are more accurate than other parallel ADC implementations because the controller circuitry 108 tracks both offset error and gain error.

Figure 11:
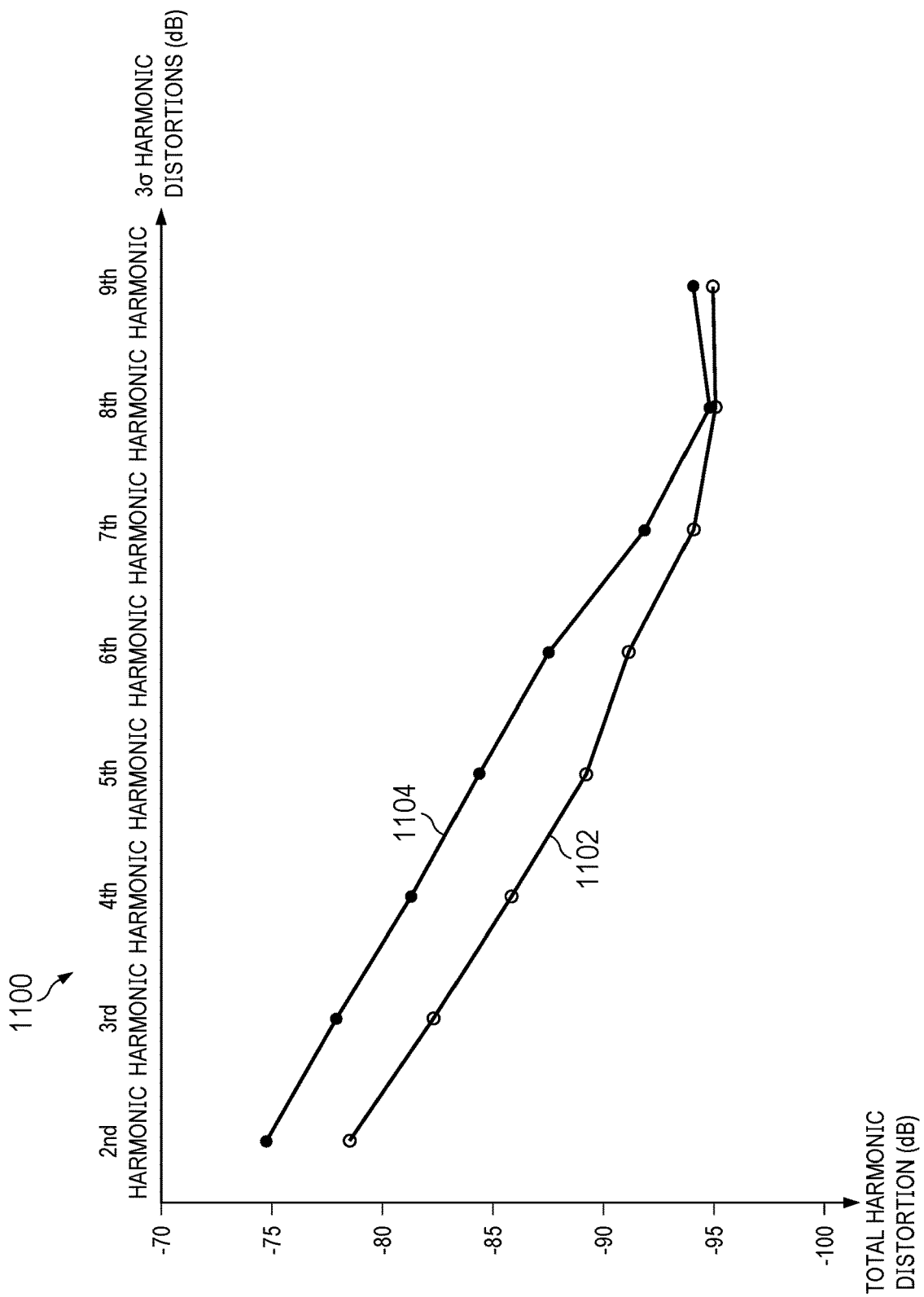
FIG. 11 is a graph describing an example performance of the ADC circuitry of FIG. 2 when subjected to offset error.

FIG. 11 is a graph describing an example performance of the ADC circuitry of FIG. 2 when subjected to offset error. FIG. 11 includes an example graph 1100 and example signals 1102 and 1104. The x axis of the graph 1100 represents harmonic distortions (HDs) of the output a parallel ADC architecture device. A harmonic distortion is a ratio between the root mean square (RMS) voltage of a harmonic frequency (e.g., the second harmonic, third harmonic, etc.) and the RMS voltage of the fundamental frequency (e.g., the first harmonic). The graph 1100 represents low SnR scenarios where the magnitude of each harmonic distortion on the x axis is in the 99.7th percentile (e.g., three standard deviations above the magnitude of an average harmonic distortion). The y axis of the graph 1100 represents the total harmonic distortion (THD) seen at the output of the parallel ADC architecture device. The x and y axes are both measured in decibels.

The signal 1102 represents a parallel ADC architecture device that is connected to the controller circuitry 108 as described in the teachings of this description. The signal 1104 represents a parallel ADC architecture connected to an existing controller.

The graph 1100 shows the controller circuitry 108 is more accurate at error correction than the existing controller. For example, the signal 1102 improves upon the signal 1104 by approximately 5 dB in each of the second, third, fourth, fifth, and sixth HDs. The controller circuitry 108 is more accurate at least in part because of the tracking of high frequency noise (e.g., flicker noise over 100 Hz).

Figure 12:
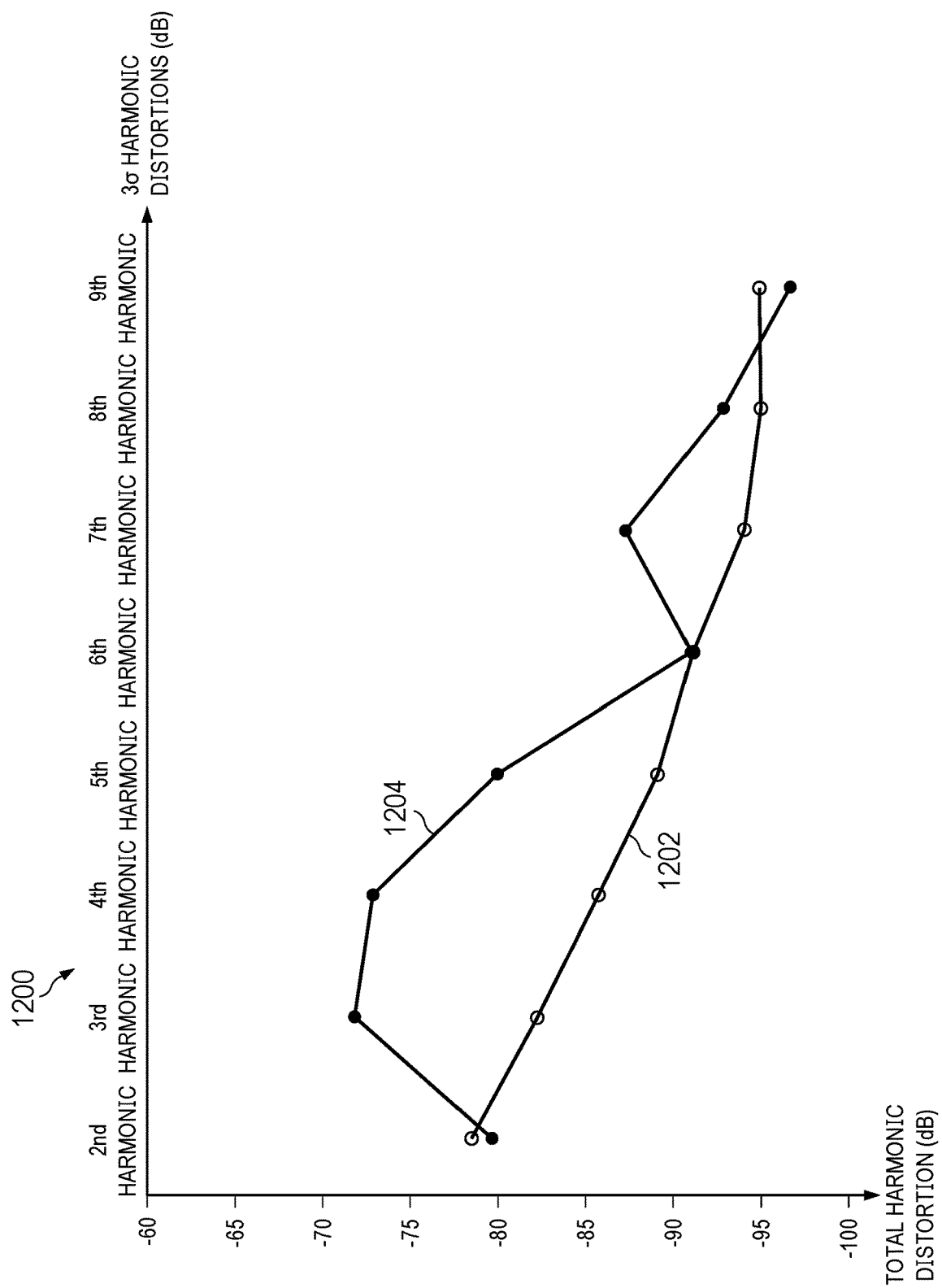
FIG. 12 is a graph describing an example performance of the ADC circuitry of FIG. 2 when subjected to gain error.

FIG. 12 is a graph describing an example performance of the ADC circuitry of FIG. 2 when subjected to gain error. FIG. 12 includes an example graph 1200 and example signals 1202 and 1204. Like FIG. 11, The x axis of the graph 1200 represents harmonic distortions (HDs) of the output a parallel ADC architecture device. The graph 1200 represents low SnR scenarios where the magnitude of each harmonic distortion on the x axis is in the 109.7th percentile (e.g., three standard deviations above the magnitude of an average harmonic distortion). The y axis of the graph 1100 represents the total harmonic distortion (THD) seen at the output of the parallel ADC architecture device. The x and y axes are both measured in decibels.

The signal 1202 represents a parallel ADC architecture device that is connected to the controller circuitry 108 as described in the teachings of this description. The signal 1204 represents a parallel ADC architecture connected to an existing controller.

The graph 1200 shows the controller circuitry 108 is more accurate at error correction than the existing controller. For example, the signal 1102 improves upon the signal 1104 by approximately 10 dB at the fourth HD. The controller circuitry 108 is more accurate at least in part because of the tracking of high frequency noise (e.g., flicker noise over 100 Hz).

Figure 13:
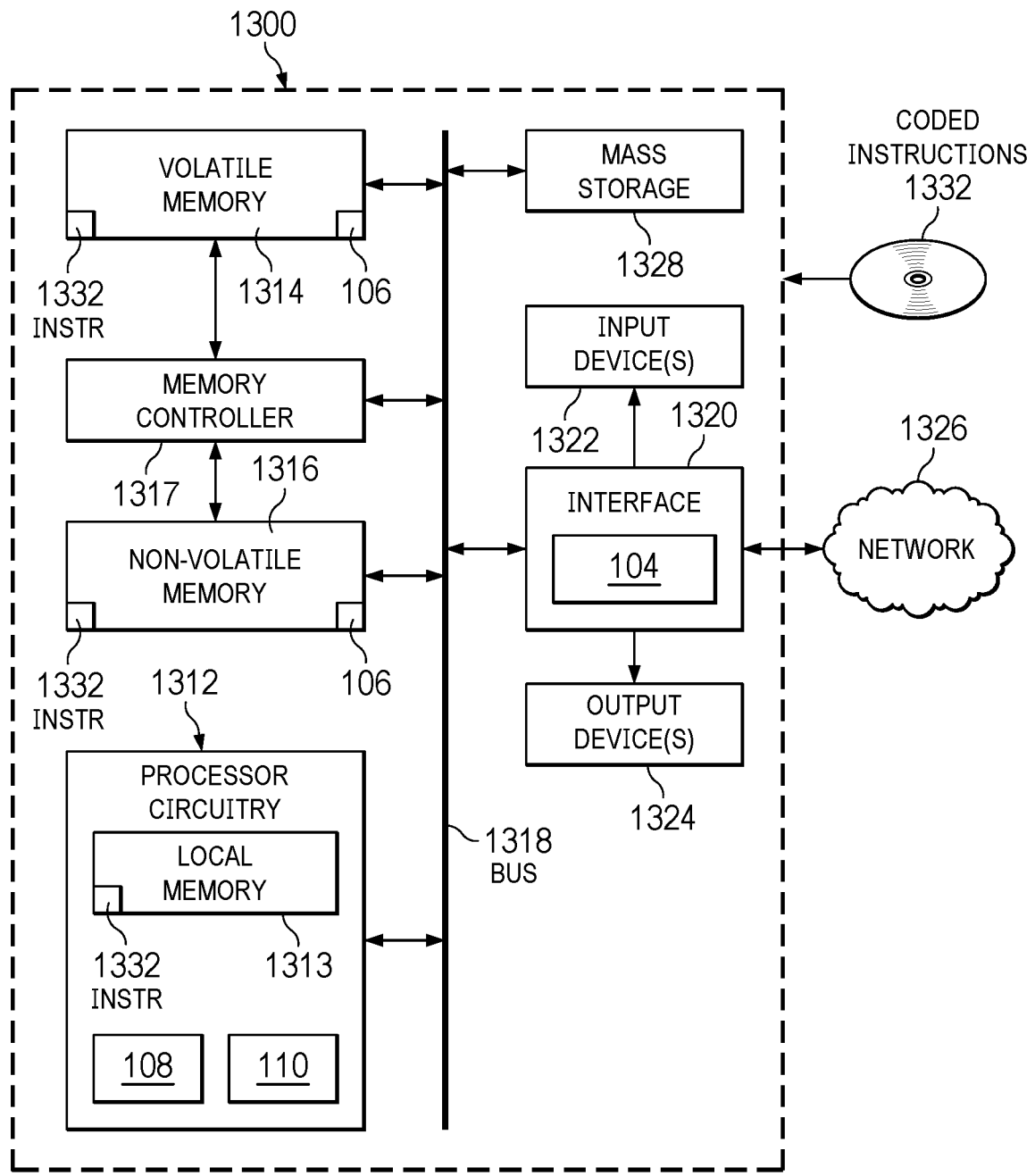
FIG. 13 is a block diagram of an example processing platform including programmable circuitry structured to execute, instantiate, and/or perform the example machine readable instructions and/or perform the example operations of FIGS. 7-10 to implement the controller circuitry 108 of FIG. 2.

FIG. 13 is a block diagram of an example programmable circuitry platform 1300 structured to execute and/or instantiate the example machine-readable instructions and/or the example operations of FIGS. 7-10 to implement the controller circuitry 108 of FIG. 2. The programmable circuitry platform 1300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1300 of the illustrated example includes programmable circuitry 1312. The programmable circuitry 1312 of the illustrated example is hardware. For example, the programmable circuitry 1312 can be implemented by one or more integrated circuits, logic circuits, FPGAs, microprocessors, CPUs, GPUs, DSPs, and/or microcontrollers from any desired family or manufacturer. The programmable circuitry 1312 may be implemented by one or more semiconductor based (e.g., silicon based) devices. In this example, the programmable circuitry 1312 implements the controller circuitry 108 and the application 110.

The programmable circuitry 1312 of the illustrated example includes a local memory 1313 (e.g., a cache, registers, etc.). The programmable circuitry 1312 of the illustrated example is in communication with main memory 1314, 1316, which includes a volatile memory 1314 and a non-volatile memory 1316, by a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1316 may be implemented by flash memory and/or any other desired type of memory device. Access to the main memory 1314, 1316 of the illustrated example is controlled by a memory controller 1317. In some examples, the memory controller 1317 may be implemented by one or more integrated circuits, logic circuits, microcontrollers from any desired family or manufacturer, or any other type of circuitry to manage the flow of data going to and from the main memory 1314, 1316. In this example, the main memory 1314, 1316 implements the memory 106.

The programmable circuitry platform 1300 of the illustrated example also includes interface circuitry 1320. The interface circuitry 1320 may be implemented by hardware using any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1322 are connected to the interface circuitry 1320. The input device(s) 1322 permit(s) a user (e.g., a human user, a machine user, etc.) to enter data and/or commands into the programmable circuitry 1312. The input device(s) 1322 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1324 are also connected to the interface circuitry 1320 of the illustrated example. The output device(s) 1324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1320 of the illustrated example, thus, may include a graphics driver card, a graphics driver chip, and/or graphics processor circuitry such as a GPU.

The interface circuitry 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1326. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc. In this example, the interface circuitry 1320 implements the ADC circuitry 104.

The programmable circuitry platform 1300 of the illustrated example also includes one or more mass storage discs or devices 1328 to store firmware, software, and/or data. Examples of such mass storage discs or devices 1328 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 1332, which may be implemented by the machine readable instructions of FIGS. 7-10, may be stored in the mass storage device 1328, in the volatile memory 1314, in the non-volatile memory 1316, and/or on at least one non-transitory computer readable storage medium such as a CD or DVD which may be removable.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C. (6) B with C, or (7) A with B and with C. As used herein in the context of describing structures, components, items, objects and/or things, the phrase "at least one of A and B" is intended to refer to implementations including any of (1) at least one A. (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A. (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A. (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that improve the accuracy of error estimation and correction in parallel ADC architectures. Described systems, apparatus, articles of manufacture, and methods improve the efficiency of using a computing device by placing both ADCs in mission mode at the same time. During mission mode, correlated but different dither signals are provided to the ADCs such that a system of equation can be solved to estimate high frequency offset error and/or gain error. Described systems, apparatus, articles of manufacture, and methods are accordingly directed to one or more improvement(s) in the operation of a machine such as a computer or other electronic and/or mechanical device.

What is claimed is:

1. Programmable circuitry configured to:
    determine a first output voltage from a first analog to digital converter (ADC) responsive to the first ADC and a second ADC both receiving a first input voltage;
    determine a first output voltage from the second ADC responsive to the first ADC and the second ADC both receiving the first input voltage;
    determine a second output voltage from the first ADC responsive to the first ADC receiving a second input voltage and the second ADC receiving the first input voltage; and
    determine an error value for the first ADC based on: (a) a difference between the first output voltage from the first ADC and the first output voltage from the second ADC, and (b) a difference between the first output voltage from the first ADC and the second output voltage from the first ADC.

2. The programmable circuitry of claim 1, wherein:
    the first input voltage is a sum of a first dither signal produced by the programmable circuitry and an input voltage produced by a voltage source; and
    the second input voltage is a sum of a second dither signal produced by the programmable circuitry and the input voltage.

3. The programmable circuitry of claim 1, wherein:
    the error value is a first error value; and
    the programmable circuitry is further configured to:
        determine a second output voltage from the second ADC responsive to the first ADC receiving the first input voltage and the second ADC receiving the second input voltage; and
        determine a second error value of the second ADC based on: (a) a difference between the first output voltage from the first ADC and the first output voltage from the second ADC, and (b) a difference between the first output voltage from the first ADC and the second output voltage from the second ADC.

4. The programmable circuitry of claim 1, wherein to estimate the error value, the programmable circuitry is configured to solve a system of equations based on: (a) the difference between the first output voltage from the first ADC and the first output voltage from the second ADC, and (b) the difference between the first output voltage from the first ADC and the second output voltage from the first ADC.

5. The programmable circuitry of claim 3, further configured to:
    determine multiple iterations of the first output voltage from the first ADC, the multiple iterations of the first output voltage within a range of voltages that is centered on a threshold voltage and has a width of one half of a step size of the first ADC; and
    estimate an instance of the error value for each iteration of the first output voltage of the first ADC, wherein the error value is estimated at a frequency that enables detection of flicker noise.

6. The programmable circuitry of claim 1, wherein the first input voltage and the second input voltage are offset by half of a step size of the first ADC.

7. The programmable circuitry of claim 1, wherein the programmable circuitry is further configured to:
    determine a third output voltage from the first ADC responsive to the first ADC receiving a third input voltage and the second ADC receiving the first input voltage; and
    estimate a gain error of the first ADC based on: (a) a difference between the first output voltage from the first ADC and the first output voltage from the second ADC, (b) a difference between the first output voltage from the first ADC and the second output voltage from the first ADC, and (c) a difference between the third output voltage from the first ADC and the first output voltage from the first ADC.

8. The programmable circuitry of claim 7, wherein the first input voltage and the second input voltage are offset by one quarter of a step size of the first ADC.

9. An apparatus comprising:
    programmable circuitry;
    a first analog to digital converter (ADC) having a first input terminal connected to the programmable circuitry and a second input connected to a voltage source; and
    a second ADC having a first terminal connected to the programmable circuitry and a second input connected to the voltage source;
    wherein the programmable circuitry is configured to:
        determine a first output voltage from the first ADC responsive to the first ADC and a second ADC both receiving a first input voltage;
        determine a first output voltage from the second ADC responsive to the first ADC and a second ADC both receiving the first input voltage;
        determine a second output voltage from the first ADC responsive to the first ADC receiving a second input voltage and the second ADC receiving the first input voltage; and
        determine an error value for the first ADC based on: (a) a difference between the first output voltage from the first ADC and the first output voltage from the second ADC, and (b) a difference between the first output voltage from the first ADC and the second output voltage from the first ADC.

10. The apparatus of claim 9, wherein:
    the first input voltage is a sum of a first dither signal produced by the programmable circuitry and an input voltage produced by the voltage source; and
    the second input voltage is a sum of a second dither signal produced by the programmable circuitry and the input voltage.

11. The apparatus of claim 9, wherein:

the error value is a first error value; and the programmable circuitry is further configured to:

determine a second output voltage from the second ADC responsive to the first ADC receiving the first input voltage and the second ADC receiving the second input voltage; and determine a second error value for the second ADC based on: (a) a difference between the first output voltage from of the first ADC and the first output voltage from the second ADC, and (b) a difference between the first output voltage from the first ADC and the second output voltage from the second ADC.

12. The apparatus of claim 9, wherein to estimate the error value, the programmable circuitry is configured to solve a system of equations based on: (a) the difference between the first output voltage from the first ADC and the first output voltage from the second ADC, and (b) the difference between the first output voltage from the first ADC and the second output voltage from the first ADC.

13. The apparatus of claim 9, wherein the programmable circuitry is further configured to:

determine multiple iterations of the first output voltage from the first ADC, the multiple iterations of the first output voltage within a range of voltages that is centered on a threshold voltage and has a width of one half of a step size of the first ADC; and estimate an instance of the error value for each iteration of the first output voltage from the first ADC, wherein the error value is estimated at a frequency that enables detection of flicker noise.

14. The apparatus of claim 9, wherein the first input voltage and the second input voltage are offset by half of a step size of the first ADC.

15. The apparatus of claim 9, wherein the programmable circuitry is further configured to:

determine a third output voltage from the first ADC responsive to the first ADC receiving a third input voltage and the second ADC receiving the first input voltage; and estimate a gain error of the first ADC based on: (a) a difference between the first output voltage from the first ADC and the first output voltage from the second ADC, (b) a difference between the first output voltage from the first ADC and the second output voltage from the first ADC, and (c) a difference between the third output voltage from the first ADC and the first output voltage from the first ADC.

16. The apparatus of claim 15, wherein the first input voltage and the second input voltage are offset by one quarter of a step size of the first ADC.

17. A method comprising:

determining, with programmable circuitry, a first output voltage from a first analog to digital converter (ADC) responsive to the first ADC and a second ADC both receiving a first input voltage;

determining, with the programmable circuitry, a first output voltage from a second ADC responsive to the first ADC and a second ADC both receiving the first input voltage;

determining, with the programmable circuitry, a second output voltage from the first ADC responsive to the first ADC receiving a second input voltage and the second ADC receiving the first input voltage; and determining, with the programmable circuitry, an error value for the first ADC based on: (a) a difference between the first output voltage from the first ADC and the first output voltage from the second ADC, and (b) a difference between the first output voltage from the first ADC and the second output voltage from the first ADC.

18. The method of claim 17, wherein:

the first input voltage is a sum of a first dither signal produced by the programmable circuitry and an input voltage produced by a voltage source; and the second input voltage is a sum of a second dither signal produced by the programmable circuitry and the input voltage.

19. The method of claim 17, wherein estimating the error value further includes: solving a system of equations based on: (a) the difference between the first output voltage from the first ADC and the first output voltage from the second ADC, and (b) the difference between the first output voltage from the first ADC and the second output voltage from the first ADC.

20. The method of claim 17, wherein the first input voltage and the second input voltage are offset by half of a step size of the first ADC.

\* \* \* \* \*